US006593562B1

(12) United States Patent
Parrish et al.

(10) Patent No.: US 6,593,562 B1
(45) Date of Patent: Jul. 15, 2003

(54) ELECTRO-OPTICAL SENSOR ARRAYS WITH REDUCED SENSITIVITY TO DEFECTS

(75) Inventors: William J. Parrish, Santa Barbara, CA (US); Naseem Y. Aziz, Goleta, CA (US); Glenn T. Kincaid, Goleta, CA (US)

(73) Assignee: Indigo Systems Corporation, Goleta, CA (US)

( * ) Notice: Subject to any disclaimer, the term of this patent is extended or adjusted under 35 U.S.C. 154(b) by 0 days.

(21) Appl. No.: 09/972,084

(22) Filed: Oct. 4, 2001

(51) Int. Cl.[7] .............................................. H01L 27/00
(52) U.S. Cl. ................................... 250/208.1; 348/246
(58) Field of Search ........................ 250/208.1; 348/246, 348/247

(56) References Cited

U.S. PATENT DOCUMENTS

| 5,119,183 A | * | 6/1992 | Weisfield et al. | ............ 358/505 |
| 5,896,173 A | * | 4/1999 | Hassler | ........................ 348/162 |
| 5,962,846 A | * | 10/1999 | Goossen | .................. 250/214.1 |
| 6,011,531 A | * | 1/2000 | Mei et al. | ...................... 345/92 |

OTHER PUBLICATIONS

A. Darryl Adams et al., "Optimizing Scanning Array Performance Using Gain Normalization And Time Delay And Integrate (TDI) Pixel Deselection During Readout, Hybrid And focal Plane Testing", SPIE vol. 1686 Test and Evaluations of IR Detectors and Arrays II, (1992), pp. 188–203.
John L. Vampola, "The Infrared and Electro–Optical Systems Handbook", Chapter 5, Electro–Optical Components, vol. 3, published 1993, pp. 295–342.

* cited by examiner

Primary Examiner—Stephone B. Allen
Assistant Examiner—Eric Spears
(74) Attorney, Agent, or Firm—MacPherson Kwok Chen & Heid LLP

(57) ABSTRACT

An electro-optical sensor includes a detector pixel including a plurality of detector elements responsive to electromagnetic radiation, and a plurality of switches configurable to selectively combine signals from the detector elements in the detector pixel to provide a signal corresponding to a pixel in an image. The sensor may include a plurality of such detector pixels arranged, for example, in a linear array or in a two-dimensional array. Each of the detector pixels may have an associated group of switches configurable to selectively combine signals from the detector elements in the detector pixel.

27 Claims, 16 Drawing Sheets

ELECTRO-OPTICAL SENSOR ARRAYS WITH REDUCED SENSITIVITY TO DEFECTS

FIELD OF THE INVENTION

This invention relates to electro-optical sensor arrays.

BACKGROUND

Electro-optical sensors are used in many systems where it is required to sense a portion of the electromagnetic spectrum. These systems include fiber-optics, telecommunications devices, electronic cameras, and machine vision equipment, as well as many other commercial and military systems. The electro-optical sensor components that allow these systems to sense electromagnetic radiation can be critical in determining the performance, sensitivity, cost, and dynamic range for the entire system.

Many modern electro-optical sensors contain two primary functional elements: a detector element or array of detector elements, and a read-out circuit. The term "detector element" is used herein to refer to an individual light detector or to the smallest individual light detecting regions in a detector array. The detector elements receive electromagnetic radiation and convert it into electrical signals. The read-out circuit, frequently an integrated circuit known as a read-out integrated circuit (ROIC), processes the electrical signals produced by one or more detector elements into a signal that is useful for the particular system in which the sensor is employed.

One common type of detector element is the photovoltaic junction detector element. FIG. 1A is a circuit diagram and FIG. 1B is a cross-sectional side view of a typical pn junction photovoltaic detector element 2. In the example of FIG. 1A, detector element 2 is a diode structure including an anode 4 and a cathode 6. A terminal 8 is electrically coupled to anode 4, and a terminal 10 is electrically coupled to cathode 6. Detector element 2 may be fabricated by diffusing a p-type region 12 into an n-type semiconductor 14, thereby forming a pn junction as shown in FIG. 1B. Since detector element 2 is a diode structure that is responsive to illumination, detector element 2 is also called a photodiode.

An electro-optical sensor may be used to spatially sample an electro-magnetic image in discrete sections referred to as pixels (picture elements). The term "detector pixel" is used herein to refer to one or more detector elements electrically coupled to provide a signal corresponding to an individual pixel in an image. In most conventional electro-optical sensors a detector pixel includes only one detector element. For example, the single detector element 2 illustrated in FIG. 1A may be used to sample a single pixel in an image. To sample the image of, for example, a line, the single detector element 2 may be scanned across the line (or the line scanned across the detector element). The electromagnetic radiation received at the detector element 2 is collected sequentially in time as the detector element moves relative to the line.

Alternatively, an image of a line may be sampled (without scanning) with a conventional linear array of detector elements each of which samples a pixel of the image of the line. In typical linear arrays, individual detector elements are fabricated next to each other in close proximity and in the necessary quantity to support the system application. FIG. 2A is a circuit diagram and FIG. 2B is a perspective view of a conventional pn junction photovoltaic detector array 16. In the example of FIG. 2A, detector array 16 includes four detector elements 2, each with terminals 8 and 10. In FIG. 2B, four p-type regions 12 (one for each detector element 2) are shown arranged in a line and diffused into n-type semiconductor 14. A linear array 18 having 72 closely spaced detector elements 2 is illustrated in FIG. 3. Typical linear arrays contain as many as 512 or more of such closely spaced detector elements.

For many applications one-dimensional image sampling with a linear array is adequate to provide the necessary information for the system. Spectrometers are an example of this type of application. For applications requiring two-dimensional image information, the image to be sampled may be scanned across the linear array and sampled sequentially in time to capture the image. Scanning mirrors and scanning mechanisms are typically used to provide this capability.

Sampling of a two-dimensional image without scanning may be accomplished with a conventional two-dimensional array of detector elements (also called a staring array) such as detector array 20 illustrated in FIG. 4. Although array 20 includes 1024 detector elements 2 in a 32 by 32 arrangement, it is typical to find two-dimensional arrays containing as many as 1024×1024 detector elements. Array 20 can acquire a 32 by 32 pixel two-dimensional image without the use of a scanning mirror or scanning mechanism if each detector element samples a pixel of the image.

In electro-optical sensors, each detector element in the detector array is electrically connected to the read-out circuitry. In the case of a detector that has a single detector element 2, as in FIG. 1A, it is reasonable to consider electrically connecting to the detector by means of wires and/or printed circuit board traces. However, in one-dimensional linear arrays, such as arrays 16 (FIGS. 2A and 2B) and 18 (FIG. 3), or in two-dimensional staring arrays, such as array 20 (FIG. 4), it becomes unrealistic to interface to the detectors using these methods. These arrays may contain from 512 detector elements to over one million detector elements, thus requiring from 512 to over one million electrical connections respectively. Furthermore, the detector elements are typically small, having widths of, e.g., 25 μm, and are closely spaced within the array. Thus, for example, 1 by 72 linear array 18 (FIG. 3) may have a total width of less than 2 mm. To allow for the small size of the detector elements and array, it is desirable to electrically interface the detectors directly to the readout circuit. It is also desirable to have the readout circuit elements in close physical and electrical proximity to the detector elements due to noise and manufacturing considerations. To meet these requirements for the electrical connection, integrated circuit wire bonding techniques and bump bonding technologies are employed to electrically connect detector elements to the read-out circuit.

FIG. 5 illustrates an electro-optical sensor 22 including a detector array 24 (linear or two dimensional) interfaced to an ROIC 26 through wire bonding or bump bonding techniques. Detector array 24 is in direct electrical contact with ROIC 26 and signals from each of the detector elements in the array are connected to interface electronics in ROIC 26. Each bump bond connects a detector element to a corresponding set of interface electronics, often called the unit cell, which is located directly under the detector elements. The interface electronics, or unit cell, of the ROIC often provides the functions of biasing the detectors, integrating signal from the detectors, and multiplexing the integrated signals to the periphery of the array and to the system.

ROICs are typically formed in silicon using Complementary Metal Oxide Semiconductor (CMOS) technology. For electro-optical sensors that detect electromagnetic radiation in the visible spectrum and/or in the infrared spectrum up to a wavelength of approximately 1.0 µm, silicon can be used to form the detector as well as the readout circuit. For optical sensor components that operate at significantly shorter or longer wavelengths, alternate detector materials may be selected to provide the appropriate sensitivity for the desired region of the electromagnetic spectrum. For example, electro-optical sensors that detect infrared radiation may employ Indium Gallium Arsenide (InGaAs) or Indium Antimonide (InSb) as the detector materials. In such cases, the material used for the detector may be different from the silicon CMOS material technology that is preferred for use in the ROIC.

A problem with electro-optical sensors is that defects that can degrade sensor performance may occur in the detector elements. These defects occur as a result of the materials or manufacturing processes used to form the detector elements. For example, detector materials such as Indium Gallium Arsenide (InGaAs) often contain defects that manifest themselves as regions where the n and p layers are short-circuited together. Such defects may arise, for example, from the lattice mismatch between the Indium Phosphide (InP) substrate and the InGaAs material deposited on top. Detector defects may also occur, for example, during photolithographic or metallization steps in the manufacturing process. Defects in the detector elements are typically very small compared to the size of the detector elements and are randomly distributed throughout the sensor. Generally, non-silicon based detector materials, such as InGaAs, have a much higher defect density than silicon based detectors.

One of the more detrimental effects of detector defects is that the defects can alter the bias voltage versus current (I-V) characteristics of a detector element. In particular, defects that short-circuit a photovoltaic detector element make the detector element's I-V characteristics more ohmic depending on the severity of the defects. For example, FIG. 6 shows I-V curves 28, 30, and 32 representative of photovoltaic detector elements having, respectively, normal (no defects), poor, and ohmic I-V characteristics. The right and left halves of FIG. 6 are typically referred to as the forward bias region (FB) and the reverse bias region (RB), respectively. Under forward bias, a photovoltaic detector's zero current intercept, or forward voltage, is a function of the illumination level. Similarly, under reverse bias the reverse bias current is a function of the illumination level. In addition, the reverse bias current contains a junction leakage current component and, under high reverse bias conditions, a reverse bias breakdown current component. The magnitude of the leakage current and/or reverse bias break down current may be large compared to the detector photocurrent and typically depends on the properties of the detector material. In particular, material and manufacturing defects may degrade the detector reverse bias current performance.

For each of the detector elements represented by I-V curves 28, 30, and 32 a unique offset reverse bias current 34, 36, and 38, respectively, develops as a result of reverse biasing the detector elements at, for example, $V_{RB}$. These offset currents, which depend on the number and severity of defects in the detector element, have the effect of introducing variations in the output signals for the detector elements. In some cases these variations can represent a significant portion of the dynamic range for the detector element signal levels. In addition, the defects can also degrade the noise performance of the detector elements.

In most conventional electro-optical sensor arrays the detector elements interconnect to the ROIC signal processing electronics and/or multiplexing circuitry directly. In these devices the signals from the detector elements are integrated and multiplexed irrespective of the quality of the detector element. For example, a defective detector element that provides an abnormally high or an abnormally low detector current would have its signal multiplexed in the output of the ROIC irrespective of these anomalies. Consequently, the existence of defective detector elements in conventional detector arrays can be a serious problem if the array is used in an application that requires a high level of performance. For example, in some telecommunications systems a conventional linear array of detector elements may be used to monitor the power of individual channels of a multi-channel Dense Wavelength Division Multiplexing (WDM or DWDM) optical signal. This application may require that none of the detector pixels in the array be defective if all of the optical channels are to be monitored accurately.

In many cases detector arrays including detector elements that generate anomalous signal levels may be classified as defective arrays due to the anomalous detector elements. Moreover, the signals from the anomalous detector elements may act to alter or corrupt signals from neighboring detector elements, further reducing the likelihood for the array to meet acceptable performance levels. Hence, defects in detector elements reduce the manufacturing yield of conventional electro-optical sensor arrays.

The paper "Optimizing scanning array performance using gain normalization and time delay and integrate (TDI) pixel deselection during readout, hybrid and focal plane testing" by Darryl Adams, Greg Johnson, Noel Jolivet, Jeff Metschuleit, SPIE Vol. 1686, Test and Evaluation of IR Detectors and Arrays 1992, describes an electro-optical sensor array in which defective detector pixels are deselected prior to processing of their signals by a ROIC multiplexer and output electronics circuitry. The time delay and integrate circuitry required by this electro-optical sensor makes the sensor much more complex and thus typically more expensive than it would be otherwise. Moreover, the method described in this paper can be applied only to scanning arrays, not to staring arrays.

SUMMARY

An electro-optical sensor in accordance with the present invention includes a detector pixel including a plurality of detector elements responsive to electromagnetic radiation, and a plurality of switches configurable to selectively combine signals from the detector elements in the detector pixel to provide a pixel signal corresponding to a pixel in an image. The detector elements may be selected or deselected to contribute to the pixel signal either individually or in groups.

In one embodiment, for example, one of the switches is configurable to either include in or exclude from the pixel signal the signals provided by a group of two or more detector elements. In another embodiment, one of the switches is configurable to either include in or exclude from the pixel signal a signal provided by an individual detector element. The sensor may also include an amplifier coupled to receive the pixel signal. The gain of this amplifier may be adjustable to compensate for exclusion from the pixel signal of one or more signals provided by detector elements in the detector pixel.

Electro-optical sensors in accordance with the present invention may include a plurality of such detector pixels arranged, for example, in a linear array or in a two-dimensional array. Each of the detector pixels may have an associated group of switches configurable to selectively combine signals from the detector elements in the detector pixel.

In a method for configuring an electro-optical sensor in accordance with the present invention, detector elements included in a detector pixel are selectively electrically coupled to provide a signal corresponding to a pixel in an image. In one embodiment, the performance of detector pixels or groups of detector pixels is tested. Detector elements or groups of detector elements found to be defective may be selectively decoupled such that they do not contribute to the pixel signal.

The ability to select operable and deselect defective detector elements from detector pixels in the inventive electro-optical sensors allows such sensors to include defective detector elements and yet have all detector pixels operable. Consequently, electro-optical sensors in accordance with the present invention may be manufactured with full operability in much higher yield than is possible with prior art sensors.

BRIEF DESCRIPTION OF THE FIGURES

Like reference numbers in the various figures denote like parts in the various embodiments.

DETAILED DESCRIPTION

Electro-optical sensors in accordance with the present invention include detector pixels which comprise a plurality of sub-pixel detector elements. Signals from these sub-pixel detector elements can be selectively recombined by, for example, switches in a ROIC to provide a signal corresponding to an individual pixel in an image. Defective detector elements, for example, may be deselected from the detector pixel such that they do not contribute to the signal provided by the detector pixel.

Figure 3:
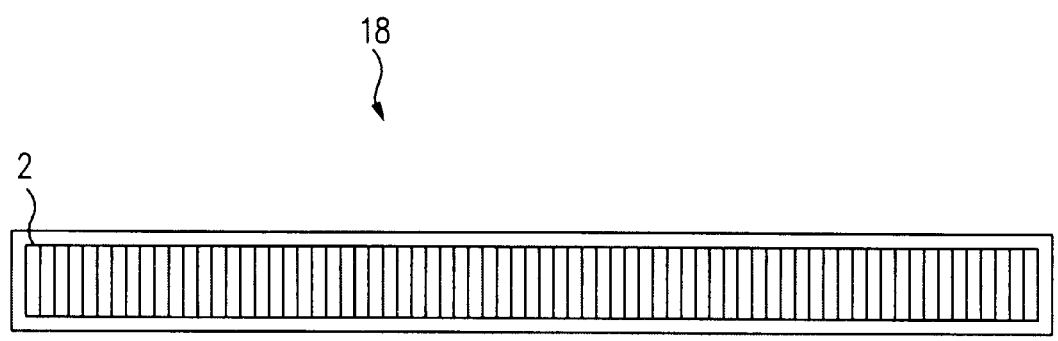
FIG. 3 is a block diagram of a typical linear photovoltaic detector array.
Figure 4:
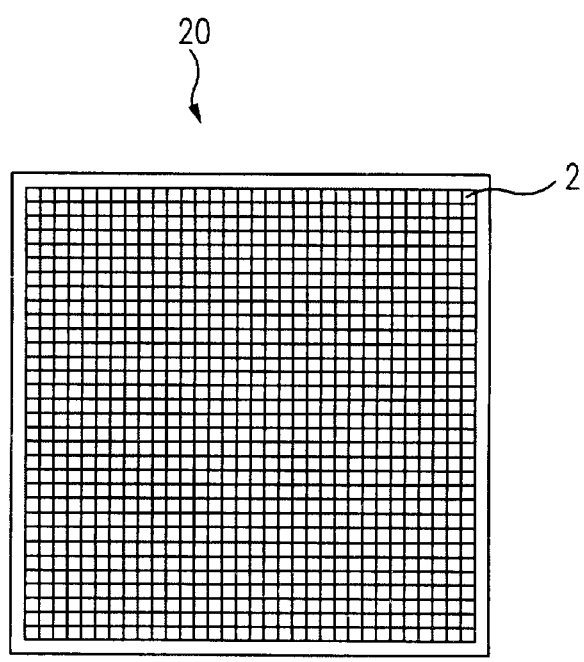
FIG. 4 is a block diagram of a typical two dimensional photovoltaic detector array.
Figure 5:
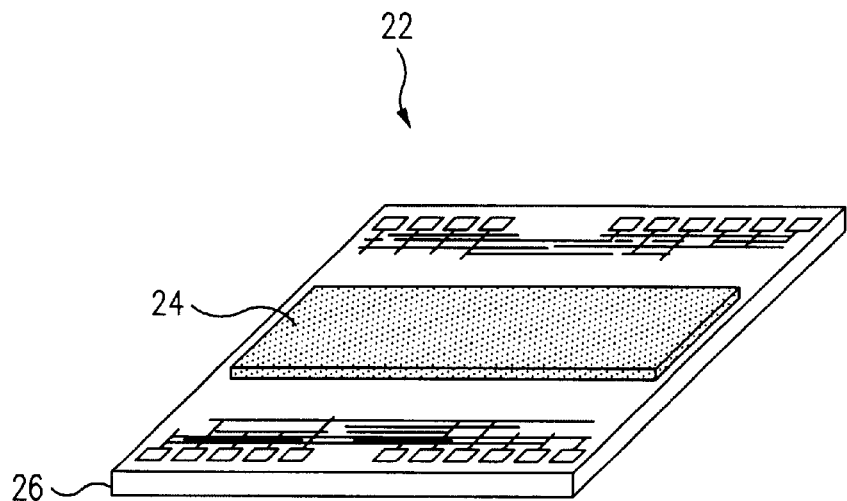
FIG. 5 is a perspective view of a typical electro-optical sensor including a photovoltaic detector array and a read-out integrated circuit.
Figure 6:
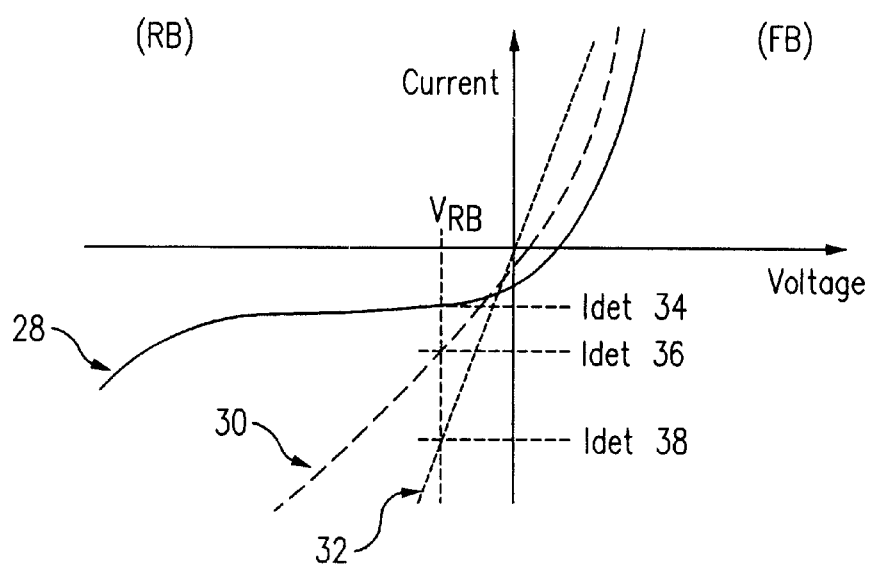
FIG. 6 is a graphical illustration of the current-voltage characteristics of several photovoltaic detector elements.
Figure 7D:
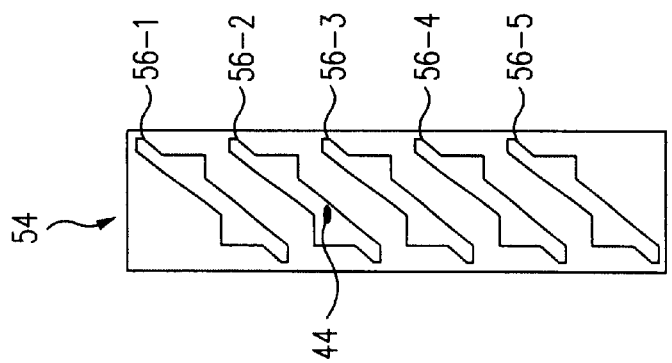
FIGS. 7B–7D are plan views of detector pixels in accordance with embodiments of the present invention.
Figure 7C:
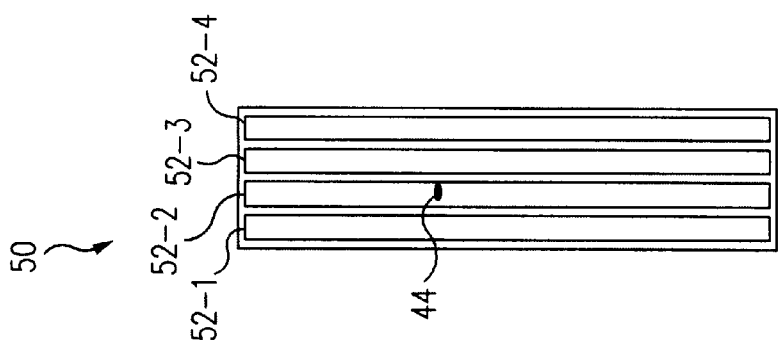
Figure 7B:
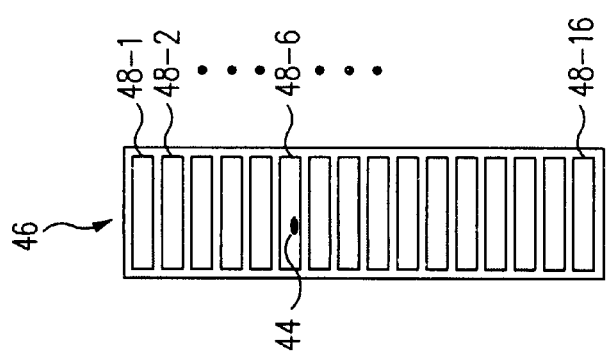
Figure 7A:
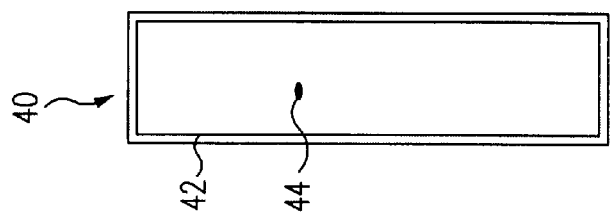
FIG. 7A is a plan view a conventional detector pixel.

FIG. 7A shows a conventional detector pixel 40 which includes only a single detector element 42. Conventional detector pixel 40 may be, for example, a detector pixel in a conventional linear array such as linear array 18 of FIG. 3 or a detector pixel in a conventional staring array such as staring array 20 of FIG. 4. In a linear array, conventional detector pixel 40 may have, for example, dimensions of about 25 microns ($\mu$m) by about 500 $\mu$m. In a staring array, conventional pixel 40 may be, for example, substantially square with dimensions of, for example, about 20 $\mu$m by about 20 $\mu$m. A pixel in an image sampled with conventional detector pixel 40 would be represented by a signal provided by detector element 42. In the example of FIG. 7A, detector element 42 includes a material or manufacturing defect 44. As described above, defect 44 can alter the performance of detector element 42 (and thus the performance of conventional detector pixel 40). Consequently, an image sampled with conventional detector pixel 40 may include erroneous pixels.

In contrast, detector pixel 46 (FIG. 7B), in accordance with an embodiment of the present invention, includes a plurality of individual sub-pixel detector elements 48-1–48-16 arranged from top to bottom. In the examples of FIGS. 7A and 7B, detector pixel 46 is approximately the same size as conventional detector pixel 40. In other implementations a detector pixel in accordance with an embodiment of the present invention may be larger or smaller than conventional detector pixels. In the example of FIG. 7B, detector element 48-6 includes material or manufacturing defect 44 which may alter its performance. The other fifteen detector elements included in detector pixel 46 are defect free, however. As described below, in accordance with the present invention, defective detector element 48-6 may be deselected from detector pixel 46 such that it does not contribute to the signal provided by detector pixel 46. Moreover, amplification of a signal provided by detector pixel 46 may be adjusted to compensate for the absence of the signal from detector element 48-6. Consequently, an image may be sampled with detector pixel 46 without error despite the presence of defect 44.

The present invention is independent of the shapes of the detector elements and of their geometrical arrangement in a detector pixel. Consequently, a variety of sub-pixel detector element configurations may be used in accordance with the present invention. In FIG. 7C, for example, detector pixel 50 includes sub-pixel detector elements 52-1–52-4 running vertically through the detector pixel and arranged from left to right. In this example defect 44 is included in detector element 52-2, while the other three detector elements are defect free. An image may be sampled with detector pixel 50 without error despite the presence of defect 44 by deselecting detector element 52-2.

The choice of geometrical configuration used for sub-pixel detector elements in embodiments of the present invention may be made based on, for example, manufacturing limitations, the nature of the detector material or manufacturing defects within the material, and optical considerations. Since detector elements are typically defined using photolithography techniques, limitations in the aligner and photoresist process capabilities may limit the size and shape of the sub-pixel detector elements. Also, the density of material or manufacturing defects in the central area of a detector pixel may differ from that at the periphery of the detector pixel. Such a variation in defect density may affect the choice of detector element height to width aspect ratio.

The characteristics of the optical image to be acquired also affect the choice of sub-pixel detector element geometry. For example, for a spectrometer in which spectral information is being acquired along a linear array of detector pixels, deselection of a sub-pixel detector element from a detector pixel organized as in detector pixel 50 (FIG. 7C) could result in information loss. For this type of application a sub-pixel organization as in detector pixel 46 (FIG. 7B) may be preferred. For applications in which the optical spot size is on the order of the detector pixel width and image jitter is present, a sub-pixel organization as in detector pixel 50 may be preferred to an organization as in detector pixel 46. FIG. 7D shows a compromise configuration of sub-pixel detector elements in detector pixel 54. Since detector elements 56-1–56-5 in detector pixel 54 are organized on a diagonal, deselection of a particular detector element will have a limited effect on the sampling of spatial information along a linear array, and minimize effects of optical spot size and off-axis optical jitter. In implementations such as that of FIG. 7D, the long axis of each detector element may be oriented at an angle of, for example, 45°±20° with respect to the long axis of the detector pixel.

Though FIGS. 7B–7D show detector pixels including particular numbers of sub-pixel detector elements, other embodiments may employ more or fewer sub-pixel detector elements in each detector pixel. Also, though the detector pixels of FIGS. 7B–7D are illustrated with particular height to width aspect ratios, other aspect ratios may also be employed. In the illustrated embodiments, the detector elements included in a detector pixel have substantially equal areas. This simplifies gain normalization of the detector pixels (e.g., adjustment of amplification to compensate for deselection of detector elements). In other embodiments, however, detector elements in a detector pixel may have different areas. Detector pixels in accordance with the present invention may be employed in two dimensional arrays of detector elements as well as in linear arrays and in either staring or scanned arrays.

An electro-optical sensor 58 (FIG. 8) in accordance with one embodiment of the present invention includes an array 60 of detector elements organized into detector pixels 62-1–62-N, and a ROIC 64. Array 60 may be, for example, a linear array of detector elements or a two dimensional array of detector elements. Detector elements included in detector pixels 62-1–62-N may be organized, for example, as described above. Array 60 may be electrically coupled to ROIC 64 with conventional bump bonds such as sets 66-1–66-N of conventional bump bonds. Typically, sets 66-1–66-N of bump bonds each include two or more bump bond connections between a detector pixel and ROIC 64. The number of bump bond connections between a detector pixel and the ROIC depends on the number of detector elements in the detector pixel and on whether the detector elements are formed into groups (as explained below) by buses on, e.g., the ROIC or the detector array.

ROIC 64 includes sets 68-1–68-N of sub-pixel switches. Each set of sub-pixel switches is electrically coupled to the sub-pixel detector elements of a corresponding detector pixel and to the input of a corresponding one of signal chains 70-1–70-N. The sets of sub pixel switches are also electrically coupled to sub-pixel selection logic 72. Each set of sub-pixel switches receives control signals from sub-pixel selection logic 72 and, in response, electrically couples selected subsets of the detector elements in the corresponding detector pixel to the corresponding signal chain. The signal chains process signals provided by the detector pixels as described below.

Figure 9:
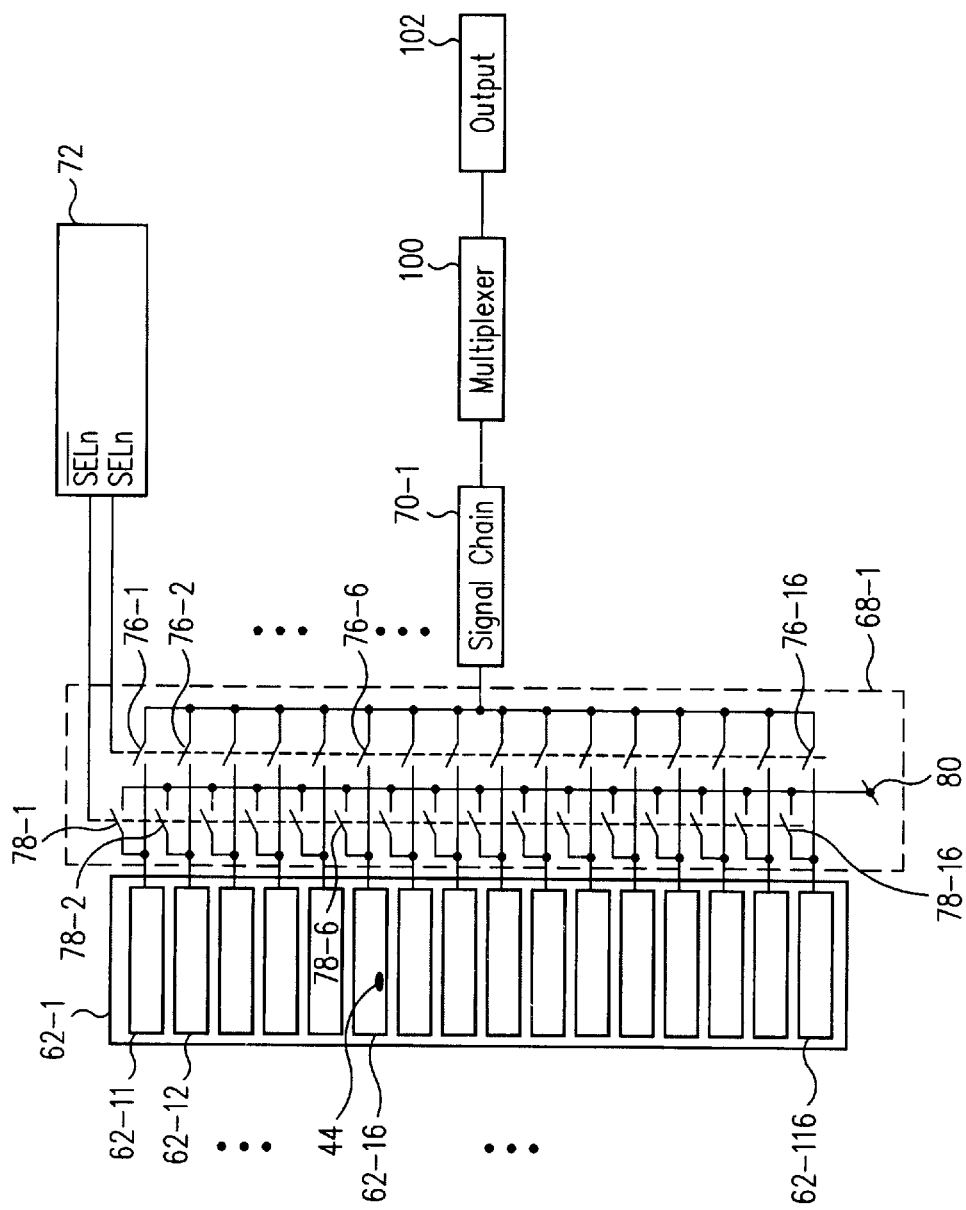
FIG. 9 is a diagrammatic view of a portion of an electro-optical sensor in accordance with an embodiment of the present invention.

In some embodiments, signals provided by each detector element in a detector pixel may be individually selected or deselected from contributing to the detector pixel signal. In the embodiment illustrated in FIG. 9, for example, detector pixel 62-1 includes 16 detector elements 62-11–62-116 organized as in detector pixel 46 (FIG. 7B). In this embodiment, set 68-1 of sub-pixel switches includes electronic switches 76-1–76-16 controlled by signals SELn (where n specifies a particular switch) provided by sub-pixel selection logic 72. Each of switches 76-1–76-16 is electrically coupled by a separate bump bond (not shown) to a corresponding one of detector elements 62-11–62-116. Hence, in this embodiment set 66-1 of bump bonds includes a separate bump bond for each detector element in detector pixel 62-1. Each of switches 76-1–76-16 is also electrically coupled to signal chain 70-1. In response to signals SELn, switches 76-1–76-16 open or close and thus electrically couple or decouple corresponding ones of detector elements 62-11–62-116 to signal chain 70-1.

Set 68-1 of sub-pixel switches also includes electronic switches 78-1–78-16 controlled by signals $\overline{\text{SELn}}$ complementary to the signals controlling switches 76-1–76-16. Each of switches 78-1–78-16 is electrically coupled to a corresponding one of detector elements 62-11–62-116 and electrically coupled to a detector common 80. In response to signals $\overline{\text{SELn}}$, switches 78-1–78-16 open or close and thus electrically couple or decouple corresponding ones of detector elements 62-11–62-116 to detector common 80. Since signals SELn and $\overline{\text{SELn}}$ are complementary, each of the detector elements is coupled either to signal chain 70-1 or to detector common 80, but not to both. In this way, signals from each of detectors 62-11–62-116 may be either shunted to detector common 80 (deselected) or selected to contribute to the signal from detector pixel 62-1. For example, the signal from detector element 62-16, which includes defect 44 in the illustrated embodiment, may be deselected by opening switch 76-6 and closing switch 78-6. Shunting (e.g., short-circuiting) deselected detector elements prevents cross-talk between the deselected detector elements and neighboring detector elements.

In other embodiments, signals provided by groups of detector elements in a pixel may be selected or deselected from contributing to the detector pixel signal. In the embodiment illustrated in FIG. 10, for example, detector pixel 62-1 includes an "A" group of detector elements 62-12, 62-14, . . . 62-116 electrically coupled to bus 82 and a "B" group of detector elements 62-11, 62-13, . . . 62-115 electrically coupled to bus 84. In this embodiment, set 68-1 of sub-pixel switches includes electronic switches 86 and 88 controlled, respectively, by signals A and B provided by sub-pixel selection logic 72. Switches 86 and 88 are electrically coupled, respectively, to buses 82 and 84 and to signal chain 70-1. In response to signals A and B, switches 86 and 88 open or close and thus electrically couple or decouple detector element groups "A" and "B", respectively, to signal chain 70-1.

Figure 10:
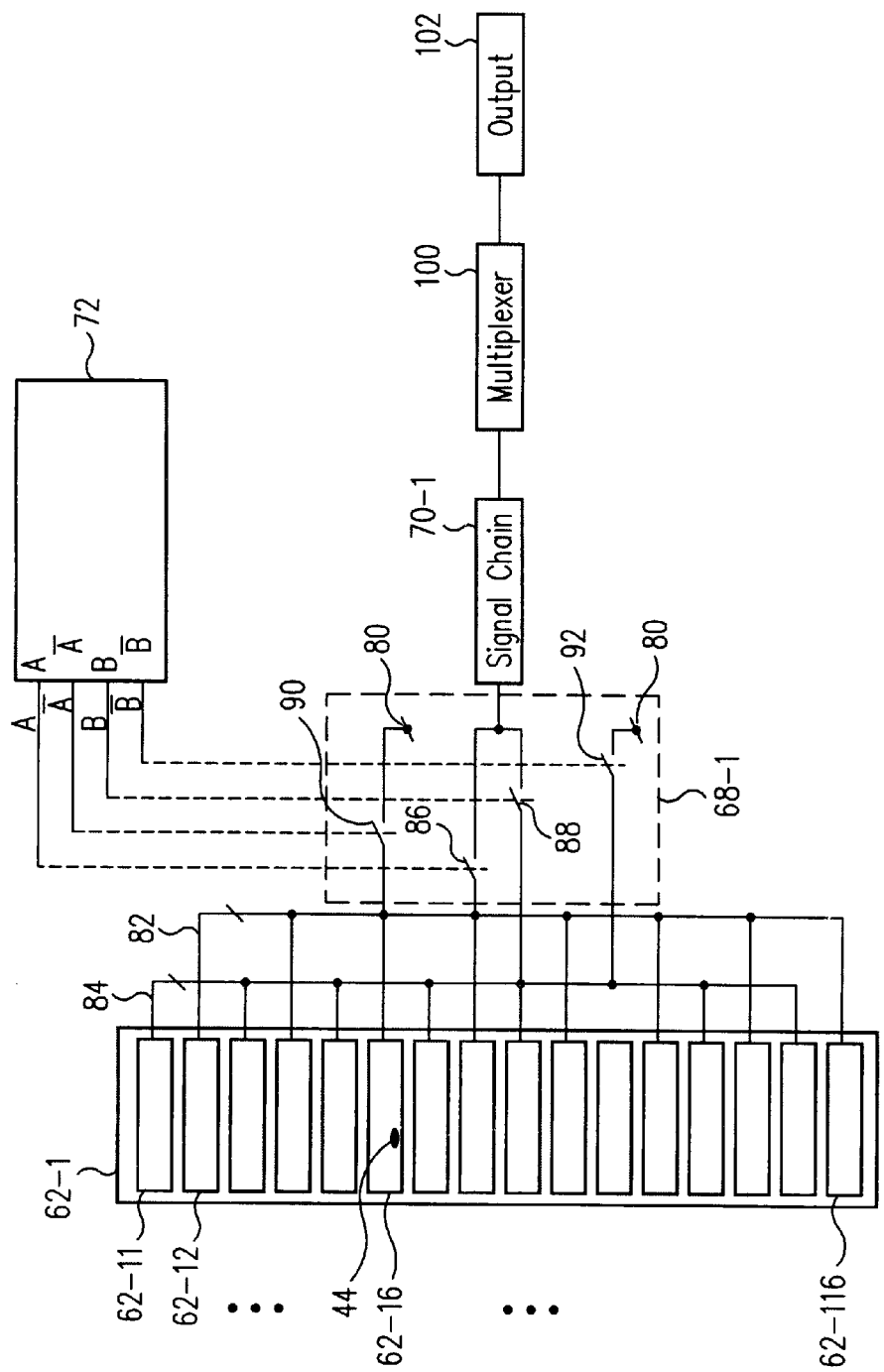
FIG. 10 is a diagrammatic view of a portion of an electro-optical sensor in accordance with another embodiment of the present invention.

In the embodiment illustrated in FIG. 10, set 68-1 of sub-pixel switches also includes electronic switches 90 and 92 controlled, respectively, by signals $\overline{A}$ and $\overline{B}$ complementary to the signals controlling switches 86 and 88, respectively. Switches 90 and 92 are electrically coupled, respectively, to buses 82 and 84 and to detector common 80. In response to signals $\overline{A}$ and $\overline{B}$, switches 90 and 92 open or close and thus electrically couple or decouple detector element groups "A" and "B", respectively, to detector common 80. Since signals $\overline{A}$ and $\overline{B}$ are complementary to signals A and B, each of the two groups of detector elements is coupled either to signal chain 70-1 or to detector common 80, but not to both. In this way, signals from detector element groups "A" and "B" may be either shunted to detector common 80 or selected to contribute to the signal from detector pixel 62-1. For example, the signals from detector group "A", which includes defective detector element 62-16 in the embodiment illustrated in FIG. 10, may be deselected by opening switch 86 and closing switch 90. In other cases, group "A", group "B", or both groups "A" and "B" may be electrically coupled to signal chain 70-1.

Figure 8:
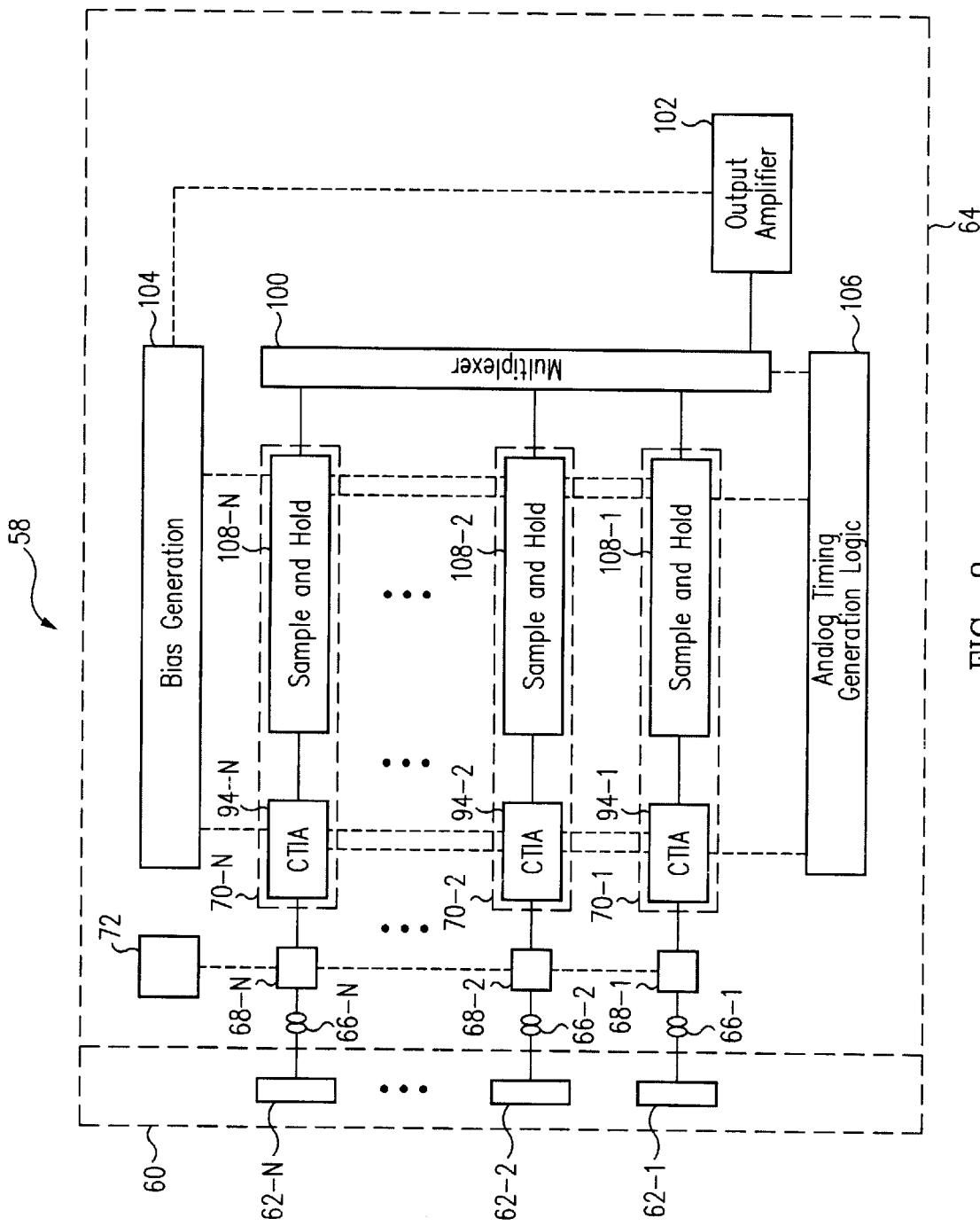
FIG. 8 is a block diagram of an electro-optical sensor in accordance with an embodiment of the present invention.

In one implementation of the embodiment illustrated in FIG. 10, buses 82 and 84 are included in detector array 60 (FIG. 8). In this implementation, bus 82 is coupled to switches 86 and 90 via a bump bond (not shown), and bus 84 is coupled to switches 88 and 92 via another bump bond (not shown). Hence, in this implementation set 66-1 of bump bonds includes a separate bump bond for each group of detector elements in detector pixel 62-1.

In another implementation of the embodiment illustrated in FIG. 10, buses 82 and 84 are included in ROIC 64. In this implementation, each of the detector elements is coupled by a separate bump bond to one or the other of buses 82 and 84. Hence, in this implementation set 66-1 of bump bonds includes a separate bump bond for each detector element in detector pixel 62-1.

Figure 11:
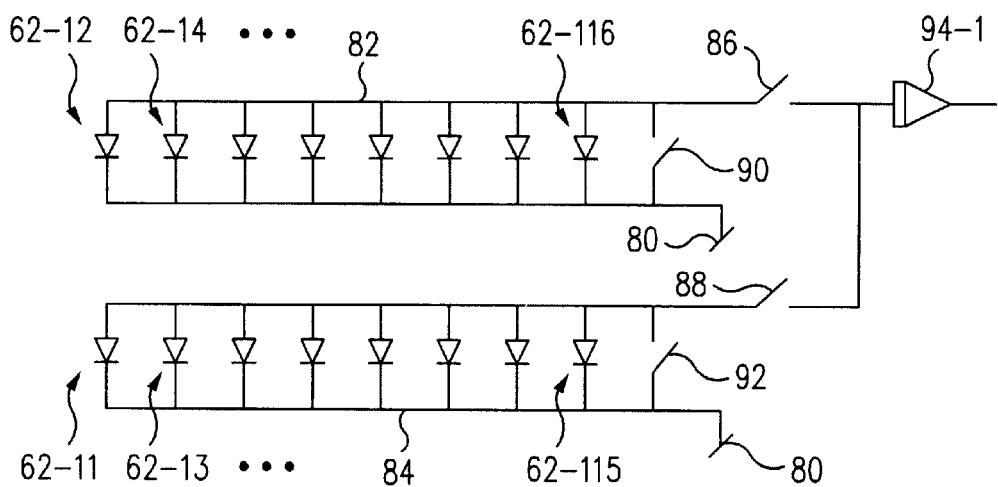
FIG. 11 is a circuit diagram of the portion of an electro-optical sensor illustrated in FIG. 10.

FIG. 11 shows a circuit diagram corresponding to an implementation of the embodiment illustrated in FIG. 10. In FIG. 11, two groups of detector elements (shown implemented as photodiodes) may be shunted by switches 90 and 92 or may be coupled by switches 86 and 88 to an integrating amplifier 94-1. Integrating amplifier 94-1, included in signal chain 70-1 (FIGS. 8 and 10) and implemented, for example, as a capacitive feedback trans-impedance amplifier (CTIA), will be discussed below.

In the illustrated embodiments detector elements are selected or deselected from a detector pixel either individually (FIG. 9) or as a member of one of two groups of detector elements (FIGS. 10 and 11). In other embodiments, however, the detector elements of a detector pixel may be organized into more than two groups, each of which can be selected or deselected from contributing to the detector pixel signal. Typically, an embodiment in which groups of detector elements are selected or deselected from a detector pixel requires less complex circuitry than an embodiment in which individual detector elements may be selected or deselected from the detector pixel. The latter embodiment will typically be more tolerant of defects, however.

Figure 12:
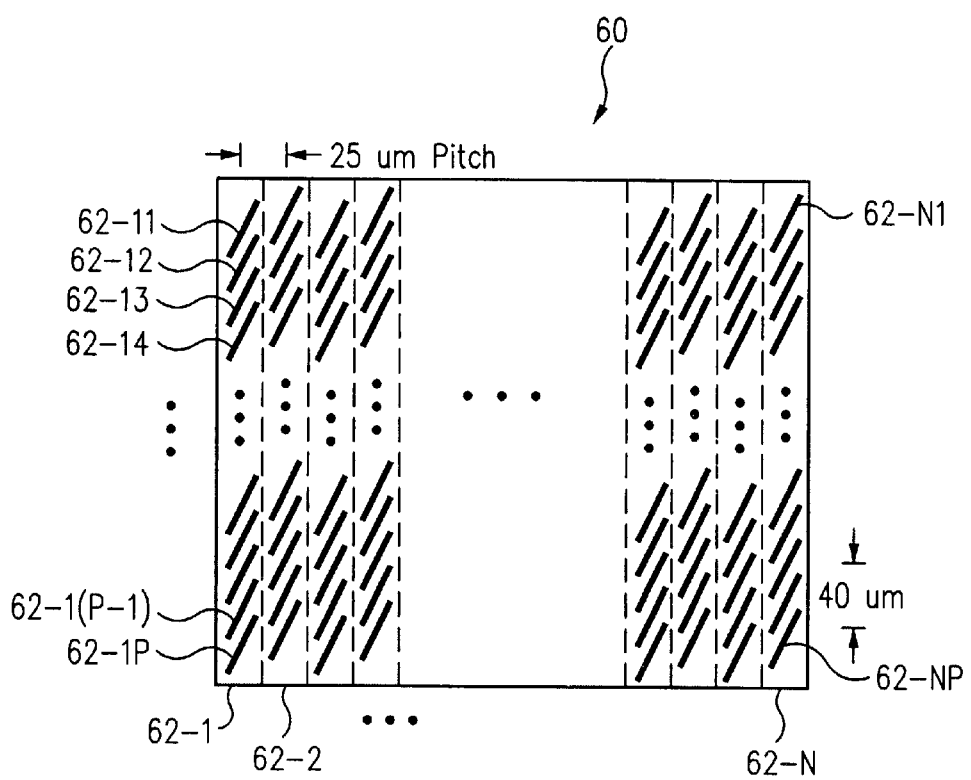
FIG. 12 is a diagrammatic view of an array of detector elements in accordance with an embodiment of the present invention.

In an embodiment illustrated in FIG. 12, array 60 (FIG. 8) includes N detector pixels 62-1–62-N arranged to form a linear array with a horizontal pitch of about 25 $\mu$m between detector pixels. Each detector pixel includes P detector elements divided between an "A" group and a "B" group in an alternating manner similar to that shown in FIGS. 10 and 11. For example, detector pixel 62-1 includes detector elements 62-11, 62-13, . . . 62-1(P-1) electrically coupled to form a group "A" and detector elements 62-12, 62-14, . . . 62-1P electrically coupled to form a group "B". The detector elements in a pixel are oriented diagonally (as in FIG. 7D) with a vertical pitch of about 20 $\mu$m between adjacent detector elements and of about 40 $\mu$m between detector elements of the same group. In one implementation, array 60 includes N=512 detector pixels each including P=24 detector elements divided between two groups of 12. In other implementations, however, array 60 may include more or fewer than N=512 detector pixels and each detector pixel may include more or fewer than P=24 detector elements divided into more or fewer than two groups.

Figure 13:
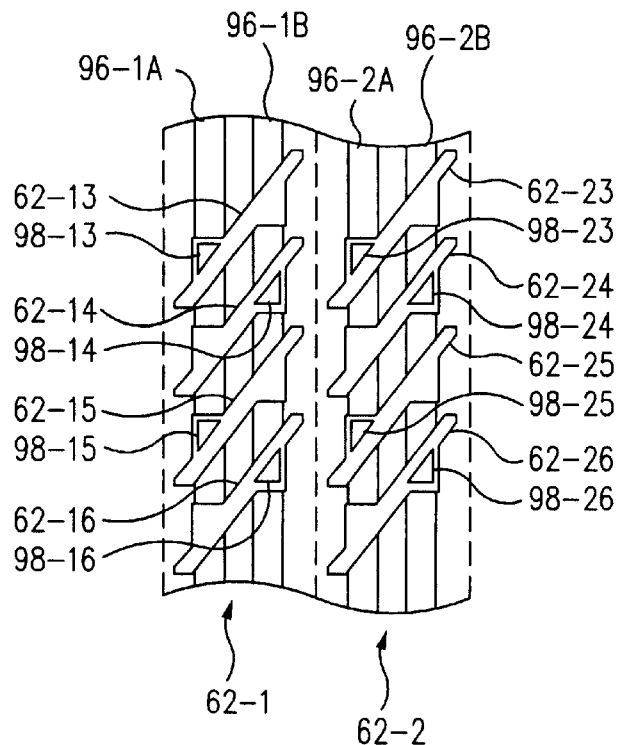
FIG. 13 shows an expanded view of a portion of the array of FIG. 12.

FIG. 13 shows an expanded view of a portion of the embodiment illustrated in FIG. 12 including portions of detector pixels 62-1 and 62-2. In the implementation shown in FIG. 13, the detector array includes group buses such as buses 96-1A–96-2B, and each of the detector elements includes a detector contact that electrically couples the detector element to a group bus. For example, detector elements 62-13 and 62-15 are electrically coupled by, respectively, contacts 98-13 and 98-15 to bus 96-1A. Bus 96-1A is also electrically coupled to the other group "A" detector elements of detector pixel 62-1 and may be electrically coupled with a bump bond (not shown), for example, to the ROIC (e.g., ROIC 64 in FIG. 8). Detector elements 62-14 and 62-16 are electrically coupled by, respectively, contacts 98-14 and 98-16 to bus 96-1B. Bus 96-1B is also electrically coupled to the other group "B" detector elements in detector pixel 62-1 and may be electrically coupled with a bump bond (not shown), for example, to the ROIC. Similarly, subsets of detector elements 62-23–62-26 in detector pixel 62-2 are interconnected to form an "A" group and a "B" group by, respectively, buses 96-2A and 96-2B. Detector elements in other detector pixels may be formed by two or more buses into two or more groups in a manner similar to that shown in FIG. 13.

In another implementation of the embodiment illustrated in FIGS. 12 and 13, the group buses (e.g., buses 96-1A–96-2B) are included in the ROIC. In this implementation, contacts such as contacts 98-13–98-16 may be bump bond connections between the detector elements in the detector array and the buses in the ROIC.

Referring again to FIG. 8, electrical signals generated by detector pixels 62-1–62-N are provided to corresponding signal chains 70-1–70-N by sets 68-1–68-N of sub-pixel switches. The signal chains amplify and integrate the input electrical signals, for example, and provide corresponding output electrical signals to conventional multiplexer 100. Conventional multiplexer 100 multiplexes the signals it receives from the signal chains and outputs the multiplexed signals through conventional output amplifier 102 to, for example, an external system in which electro-optical sensor 58 is employed. Conventional bias generation circuitry 104 provides bias signals throughout the signal chain. Conventional analog timing generation logic 106 provides timing signals to the signal chains and to the multiplexer.

Figure 14:
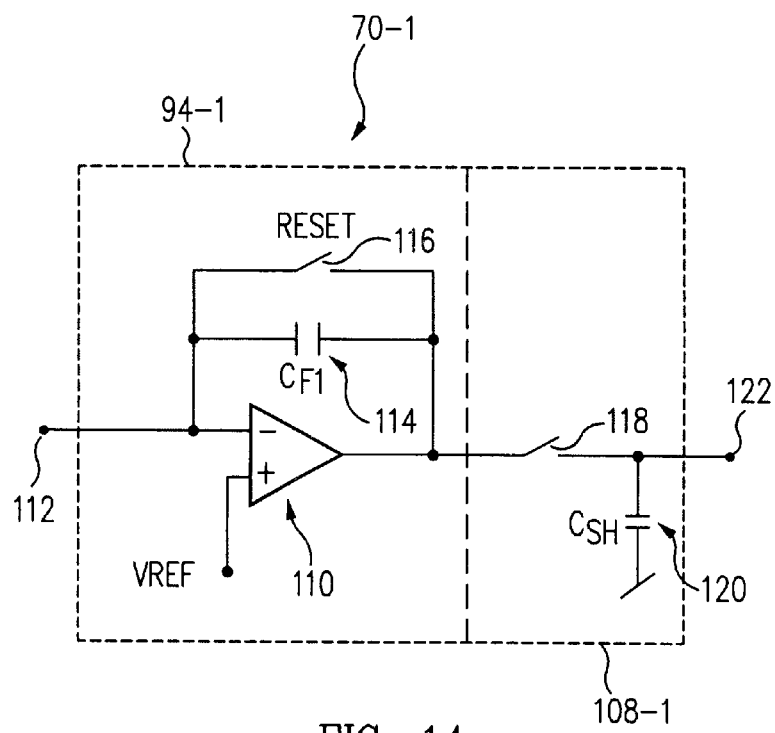
FIG. 14 is a circuit diagram of a signal chain including an integrating amplifier and a sample and hold circuit in accordance with an embodiment of the present invention.

In the embodiment illustrated in FIG. 8, each of signal chains 70-1–70-N includes a corresponding one of conventional integrating amplifiers 94-1–94-N and a corresponding one of conventional sample and hold circuits 106-1–106-N. In one implementation (FIG. 14), signal chain 70-1 includes integrating amplifier 94-1 implemented with a conventional differential amplifier 110 configured as a capacitive feedback trans-impedance amplifier. Set 68-1 of sub-pixel selection switches (not shown in FIG. 14) are electrically coupled to input 112 of signal chain 70-1 and thus to the inverting input (−) of differential amplifier 110. The non-inverting input (+) of differential amplifier 110 is coupled to a reference voltage VREF provided, for example, by bias generation circuitry 104 (FIG. 8). A feedback capacitor 114 (labeled $C_{F1}$) is coupled in parallel with a switch 116, controlled by a signal RESET, between the output of differential amplifier 110 and the inverting input (−) of differential amplifier 110. The signal RESET may be provided, for example, by analog timing generation logic 106 (FIG. 8).

Current from detector pixel 62-1 switched by set 68-1 of sub-pixel selection switches de-biases the inverting input of differential amplifier 110. The high, inverting gain of differential amplifier 110 causes the output of differential amplifier 110 to oppose the inverting input voltage change, thus generating a changing voltage across feedback capacitor 114. This maintains the inverting input (−) of differential amplifier 110 at a nearly constant voltage, while the output voltage changes in response to the input current from detector pixel 62-1. Switch 116 is used to reset integrating amplifier 94-1 and to return the input and output voltages to a reset potential.

Figure 15:
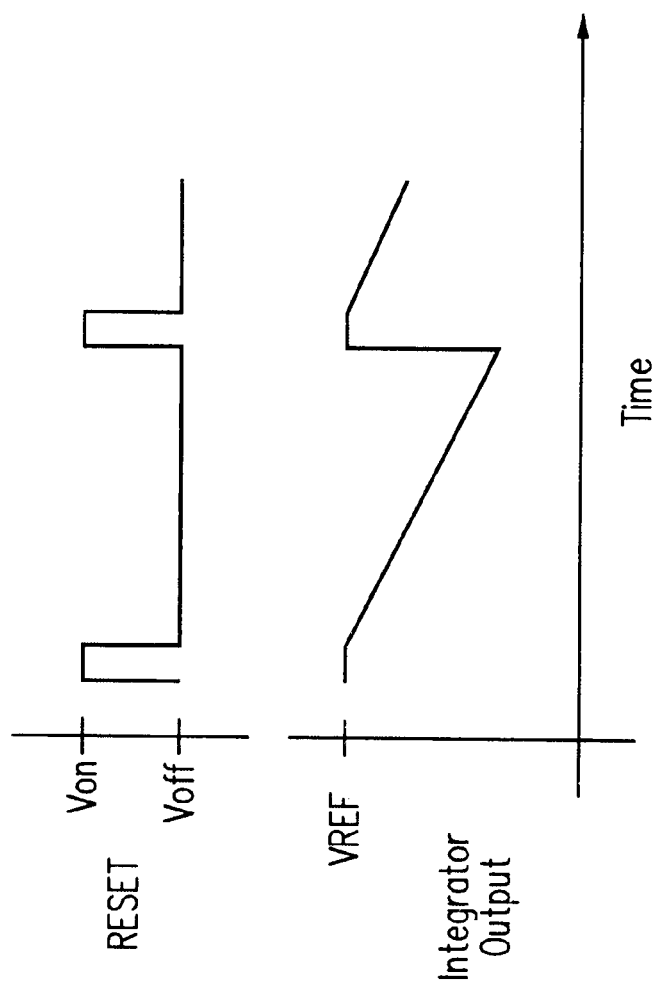
FIG. 15 is a timing diagram for the operation of the integrating amplifier in FIG. 14.

Referring to the timing diagram of FIG. 15, when signal RESET, which controls switch 116, is at a potential $V_{on}$, the output of integrating amplifier 94-1 is about equal to the reset potential VREF. After signal RESET transitions to a potential $V_{off}$, the current from detector pixel 62-1 pulls the inverting input (−) of differential amplifier 94-1 positive, causing the output of integrating amplifier 94-1 to go negative. The magnitude of the negative output signal from integrating amplifier 94-1 is representative of the current level flowing from detector pixel 62-1.

Referring again to FIG. 14, conventional sample and hold circuit 108-1 includes a switch 118 which samples the output voltage of integrating amplifier 94-1 and stores the value on a capacitor 120 (labeled $C_{SH}$). Multiplexer 100 (FIG. 8), electrically coupled to output 122 of signal chain 70-1, reads the value stored on capacitor 120. Such sample and hold circuits allow the simultaneous sampling of signals from an array of detector pixels interfaced to integrating amplifiers, and provide storage for the samples during the multiplexing process.

Figure 16:
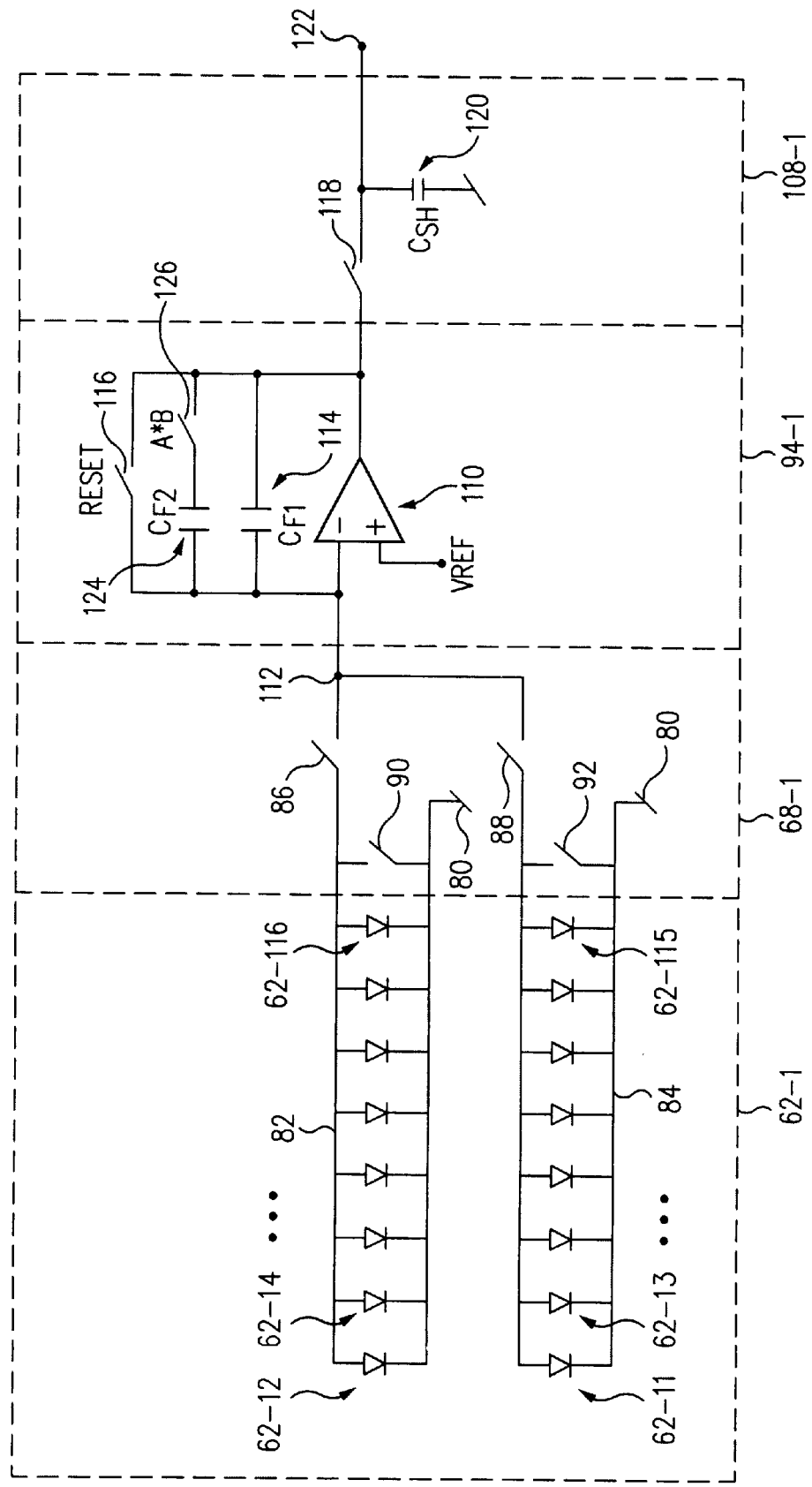
FIG. 16 is a circuit diagram including detector elements, switches, an integrating amplifier, and a sample and hold circuit in accordance with another embodiment of the present invention.

In some embodiments the gain of the integrating amplifiers in the signal chains can be adjusted to compensate for deselection of one or more detector elements from a detector pixel. In the embodiment illustrated in FIG. 16, for example, the detector elements of detector pixel 62-1 are divided into two groups (group "A" and group "B") as previously illustrated in FIGS. 10 and 11. In this embodiment, however, integrating amplifier 94-1 in signal chain 70-1 includes, in addition to the components described above, a second feedback capacitor 124 (labeled $C_{F2}$) in series with a second switch 126 and in parallel with feedback capacitor 114 and switch 116. Typically, the feedback capacitors have approximately the same capacitance. Switch 126 is controlled with a signal A*B which corresponds to the logical operation A and B. That is, switch 126 is closed when both switches 86 and 88 are closed, and switch 126 is open when either of switches 86 and 88 is open.

The gain of integrating amplifier 94-1 is inversely proportional to the total feedback capacitance. Consequently, the gain of integrating amplifier 94-1 for the case of only one of groups "A" and "B" coupled to integrating amplifier 94-1 is twice the gain for the case of both of groups "A" and "B" coupled to integrating amplifier 94-1. Thus, in this embodiment the magnitude of the amplified signal from detector pixel 62-1 remains the same whether or not one of the two detector element groups is deselected. Similar normalization schemes may be implemented for embodiments in which detector elements in detector pixels are organized into more than two selectable groups or in which individual detector elements may be selected or deselected.

The other signal chains in ROIC 64 may be implemented, for example, in manners similar to those described for signal chain 70-1.

Figure 17:
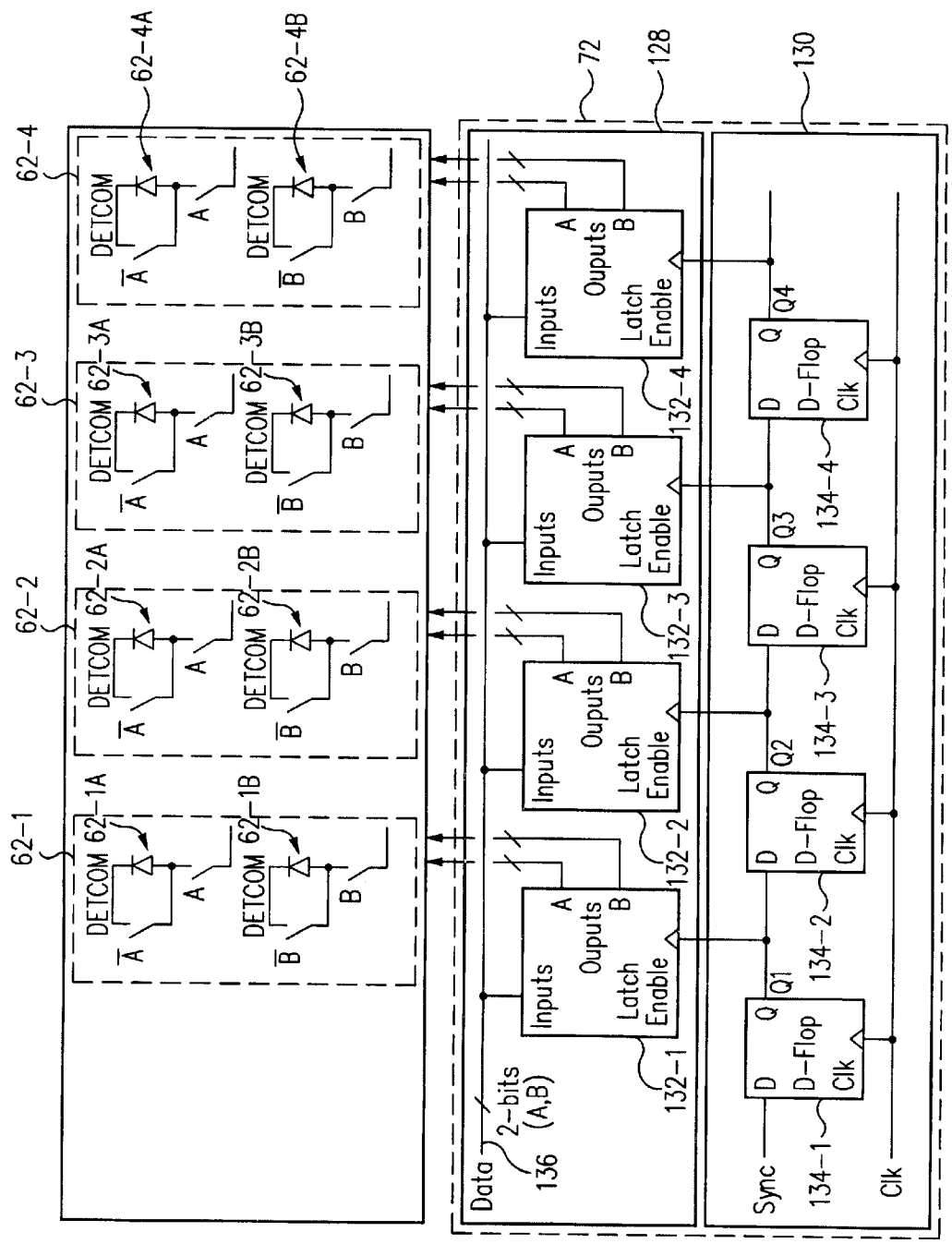
FIG. 17 diagrammatically illustrates relationships between detector elements, switches, and sub-pixel selection logic including sub-pixel selection memory and memory address logic in accordance with an embodiment of the present invention.

In one embodiment sub-pixel selection logic 72 (FIG. 8) includes sub-pixel selection memory 128 and memory address logic 130, portions of which are shown in FIG. 17. FIG. 17 also shows detector pixels 62-1–62-4 of array 60 and associated detector element switches in accordance with an embodiment in which the detector elements of each pixel are segregated into "A" and "B" groups as described above. For convenience of illustration, the detector groups (designated 62-1A–62-4A and 62-1B–62-4B) are each indicated by a single diode symbol. As described above, the switches controlled by signals A and B open or close to couple or decouple the corresponding groups of detector elements to a signal chain. The switches controlled by signals $\overline{A}$ and $\overline{B}$ may be closed to shunt the corresponding groups of detector elements.

In the embodiment illustrated in FIG. 17, sub-pixel selection memory 128 includes a latch (e.g., latches 132-1–132-4) for each detector pixel in array 60. These latches store the A and B signals that control the sub-pixel group selection switches associated with the corresponding detector pixel. A variety of addressing and memory select methods may be used to address sub-pixel selection memory 128. These methods may be realized using shift registers, decoders, and counters and a variety of well-known techniques. In the implementation shown in FIG. 17, memory address logic 130 includes a CMOS shift register comprising interconnected DQ flip-flops 134-1–134-4. In operation, a SYNCH pulse is input to the first DQ flip-flop (e.g., 134-1) and is then clocked down the shift register. As the pulse travels down the shift register it sequentially enables and then latches each of the latches in sub-pixel selection memory 128. As each of the latches is enabled, data (signals A and B) on data bus 136 is read by the latch, and then latched. In this manner each of the latches in sub-pixel selection memory 128 is serially addressed and the switch control signals are stored. Each latch in sub-pixel selection memory 128 outputs its stored signals A and B as well as their complements $\overline{A}$ and $\overline{B}$ to the sub-pixel group selection switches associated with the corresponding detector pixel.

Figure 18:
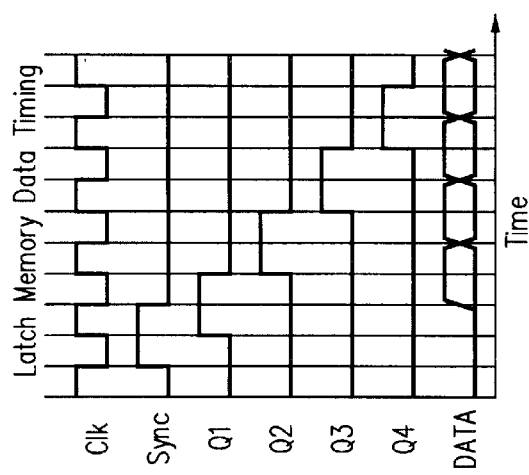
FIG. 18 is a timing diagram for the operation of the sub-pixel selection logic of FIG. 17.

Additional timing details are shown in FIG. 18, which shows the control signals SYNCH, CLK and DATA supplied to sub-pixel selection logic 72. The signal SYNCH is used to generate the shift register pulse. The shift register is clocked with the signal CLK. The clock signal CLK moves the input pulse SYNCH down the shift register enabling each subsequent latch memory. Data is latched on the rising edge of the signal CLK.

Logic control signals, analog control signals, and multiplexer control signals used in the operation of an electro-optical sensor in accordance with the present invention may all be generated using conventional CMOS logic techniques. The text book titled "Introduction to VLSI Systems" by Carver Mead and Lynn Conway, published by Addison Wesley, 1980, provides an excellent reference as to how CMOS logic can be used to generate control signals on CMOS integrated circuits.

Figure 1B:
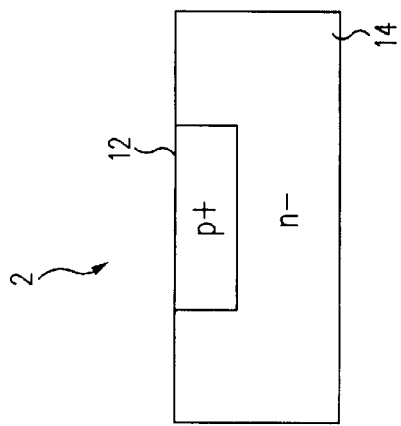
FIG. 1B is a cross-sectional side view of a typical pn junction photovoltaic detector element.
Figure 2B:
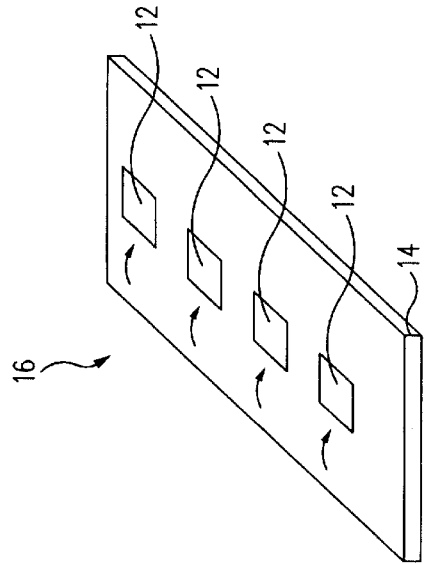
FIG. 2B is a perspective view of a typical pn junction photovoltaic detector array.
Figure 1A:
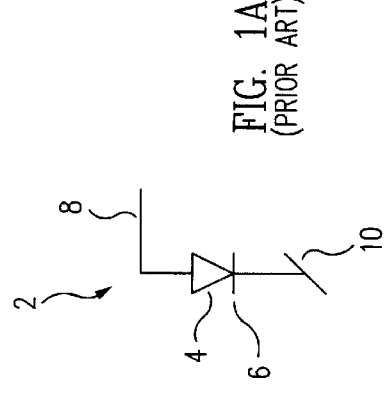
FIG. 1A is a circuit diagram of a typical pn junction photovoltaic detector element.
Figure 2A:
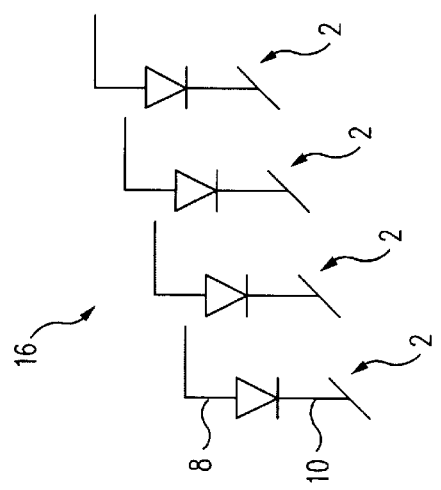
FIG. 2A is a circuit diagram of a typical pn junction photovoltaic detector array.

Detector pixels in accordance with the present invention may be employed in many different types of electro-optical sensors. In particular, although the detector elements in the illustrated embodiments have been described as photovoltaic detector elements or photodiodes, detector pixels in accordance with the present invention may include other types of detector elements. For example, detector pixels in accordance with the present invention may include photoconductive detector elements and thermal detector elements. Moreover, detector elements may be, for example, p on n devices as shown in FIGS. 1B and 2B or n on p devices. One of ordinary skill in the art would recognize that signal chains may be designed to accommodate either type of detector. In addition, although sets of sub-pixel switches 68-1–68-N and sub-pixel selection logic 72 are shown as included in ROIC 64 (FIG. 8), in other embodiments some or all of this or similar circuitry may be included in a detector element array chip or in a separate interface between a detector element array and the signal chains in an ROIC. Consequently, the specific implementation of the ROIC is not critical to the present invention. A number of suitable types of ROIC are described in "The Infrared and Electro-Optical Systems Handbook, Volume 3, Electro-Optical Components," edited by William Rogatto, ERIM SPIE Press, 1993.

Figure 19:
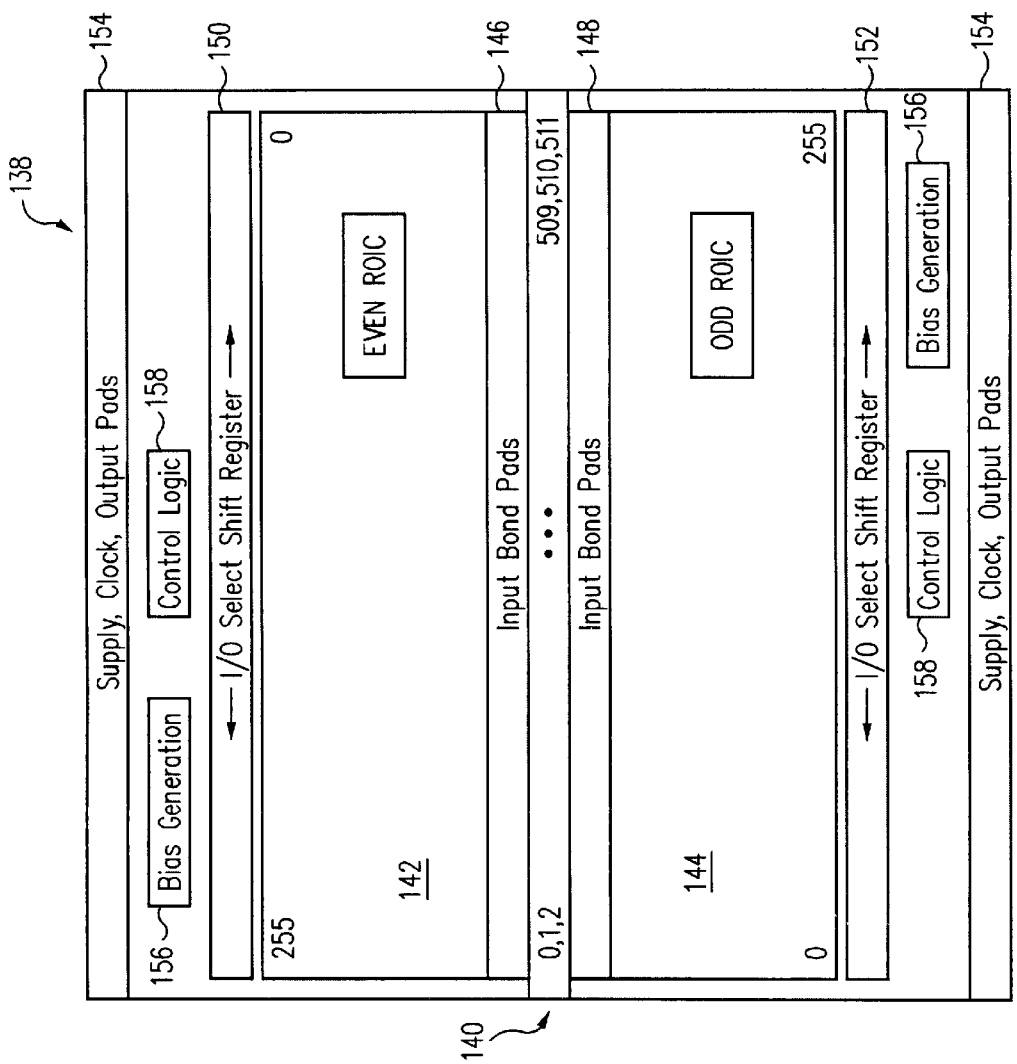
FIG. 19 diagrammatically illustrates the layout of an electro-optical sensor chip in accordance with an embodiment of the present invention.

FIG. 19 illustrates the layout of an electro-optical sensor chip 138 including a 1×512 linear array 140 of detector pixels in accordance with an embodiment of the present invention. Electro-optical sensor chip 138 is implemented with mirror symmetry around array 140, which is located along the center line of sensor chip 138. Sub-pixel selection logic and sets of sub-pixel switches are located beneath array 140. An even signal chain block 142 includes the signal chains associated with the even-numbered detector pixels of array 140. Similarly, an odd signal chain block 144 includes the signal chains associated with the odd-numbered detector pixels of array 140. Even and odd signal chain blocks 142 and 144 include input bond pad arrays 146 and 148, respectively, for coupling detector pixels in array 140 to signal chains.

Electro-optical sensor chip 138 also includes an even input/output (I/O) select shift register 150 and an odd I/O select shift register 152. Shift registers 150 and 152 perform, for example, the functions of multiplexer 100 in FIG. 8. A plurality of I/O pads 154 is used for external communication. I/O pads 154 may include pads, for example, for power supply, clock, and output coupling. Electro-optical sensor chip 138 includes in addition a plurality of bias generation circuits 156 and a plurality of control logic circuits 158 which perform, for example, the functions of bias generation circuitry 104 and analog timing generation logic 106, respectively, of FIG. 8.

Figure 20:
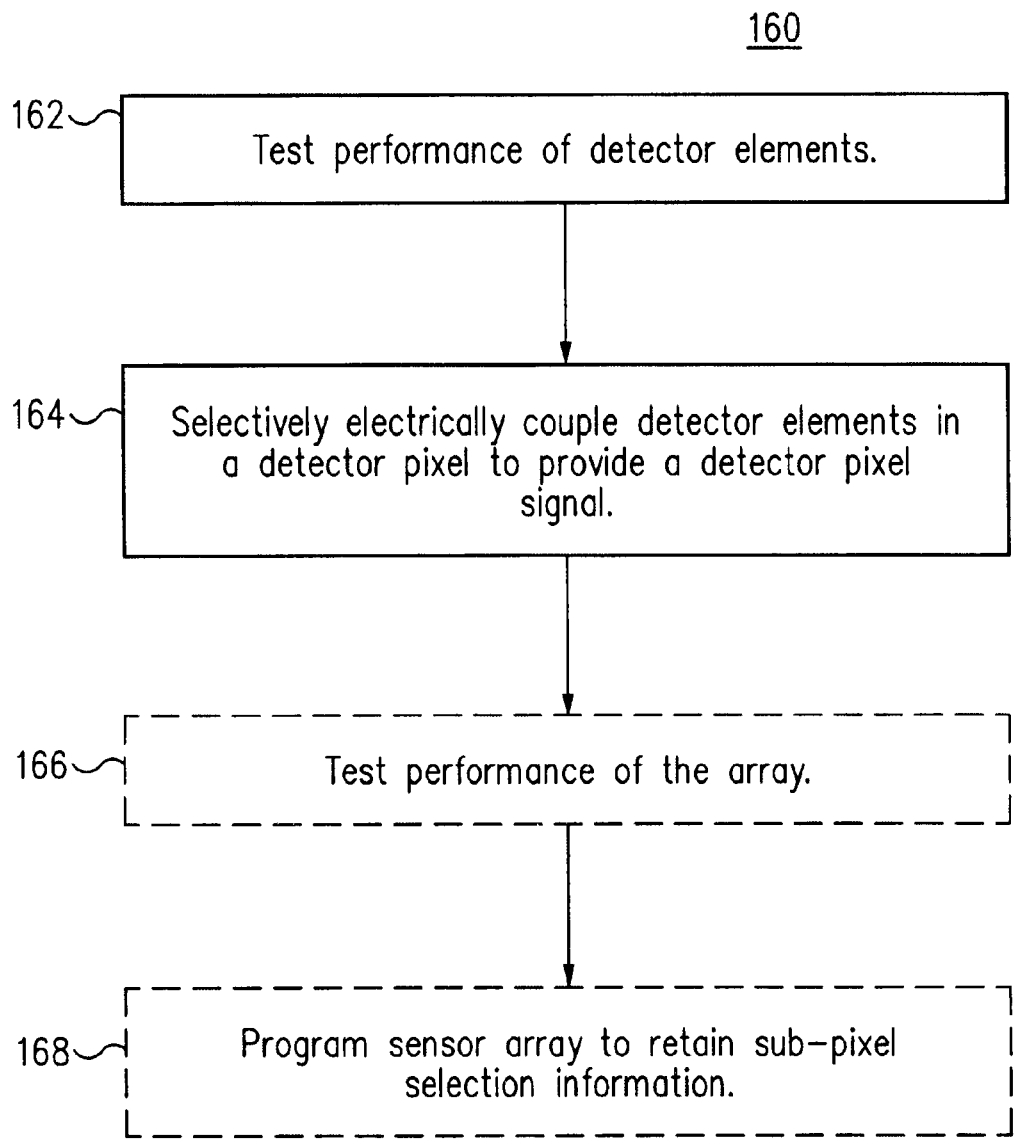
FIG. 20 is a flowchart of a method for configuring an electro-optical sensor in accordance with an embodiment of the present invention.

Electro-optical sensors in accordance with embodiments of the present invention may be configured, for example, using method 160 (FIG. 20). In step 162 of this method, the performance of detector elements included in the sensor array is tested. In an embodiment in which the detector elements in each detector pixel are segregated into a group "A" and a group "B," for example, the sub-pixel switches may be programmed to select only one group in each detector pixel. The sensor array is then electrically operated to test the performance of the selected detector element groups. These tests may include, for example, measurements of the detector elements' responsivity (response to light), offset current, leakage current, and noise level. Once a data set has been acquired characterizing the performance of the initially selected groups, the sub-pixel switches may be programmed to select the untested groups. A data set characterizing the performance of these groups is then collected. The performance of each group of detector elements can be analyzed against a set of acceptance criteria to identify adequately performing groups. Similar testing methods may be used in embodiments in which detector pixels include more than two groups of detector elements.

After the performance of the detector elements has been tested, in step 164 detector elements in a detector pixel (e.g., those in adequately performing groups) are selectively electrically coupled to provide a detector pixel signal corresponding to a pixel in an image. This may be accomplished by, for example, controlling sub-pixel switches as described above to electrically couple or decouple detector elements or groups of detector elements in a detector pixel to a signal chain in a ROIC. This step may be performed for each detector pixel which includes at least one adequately performing detector element group.

After the acceptable sub-pixel detector element groups have been selected, the electro-optical sensor may then be tested (in optional step 166) against acceptance criteria for the device. These tests may include, for example, any of the tests used in step 162 above as well as tests of the linearity of the sensor's response to light.

Electro-optical sensors with acceptable performance may be programmed (in optional step 168) to retain the sub-pixel selection information such as, for example, the signals which control the various sub-pixel switches. This process is typically referred to as factory calibration or factory optimization. This capability may be integrated into an ROIC with, for example, nonvolatile memory, EE-memory cells, or read-only memory cells such as fuse cells. Implementation of these types of functions in CMOS technology is well documented in college textbooks, trade publications, and journals.

In another implementation of method 160, detector pixels are initially tested with all of their detector elements selected. If the test indicates that a detector pixel is defective with all detector elements selected, an attempt is made to fix the detector pixel by deselecting some of its detector elements. If the reconfigured detector pixel is still defective, additional and/or different detector elements may be deselected. This process may continue until the detector pixel is determined to be either operable in a particular configuration or unfixable. Detector elements to be deselected may be chosen by applying a predetermined set of deselection rules after each failed test. For example, a deselection rule may indicate that the first detector elements to be deselected from a detector pixel should lie in a particular region of the detector pixel known to have typical failure rates higher than those of other regions. This implementation of method 160 may require fewer testing operations than the brute force implementation described above.

Figure 21:
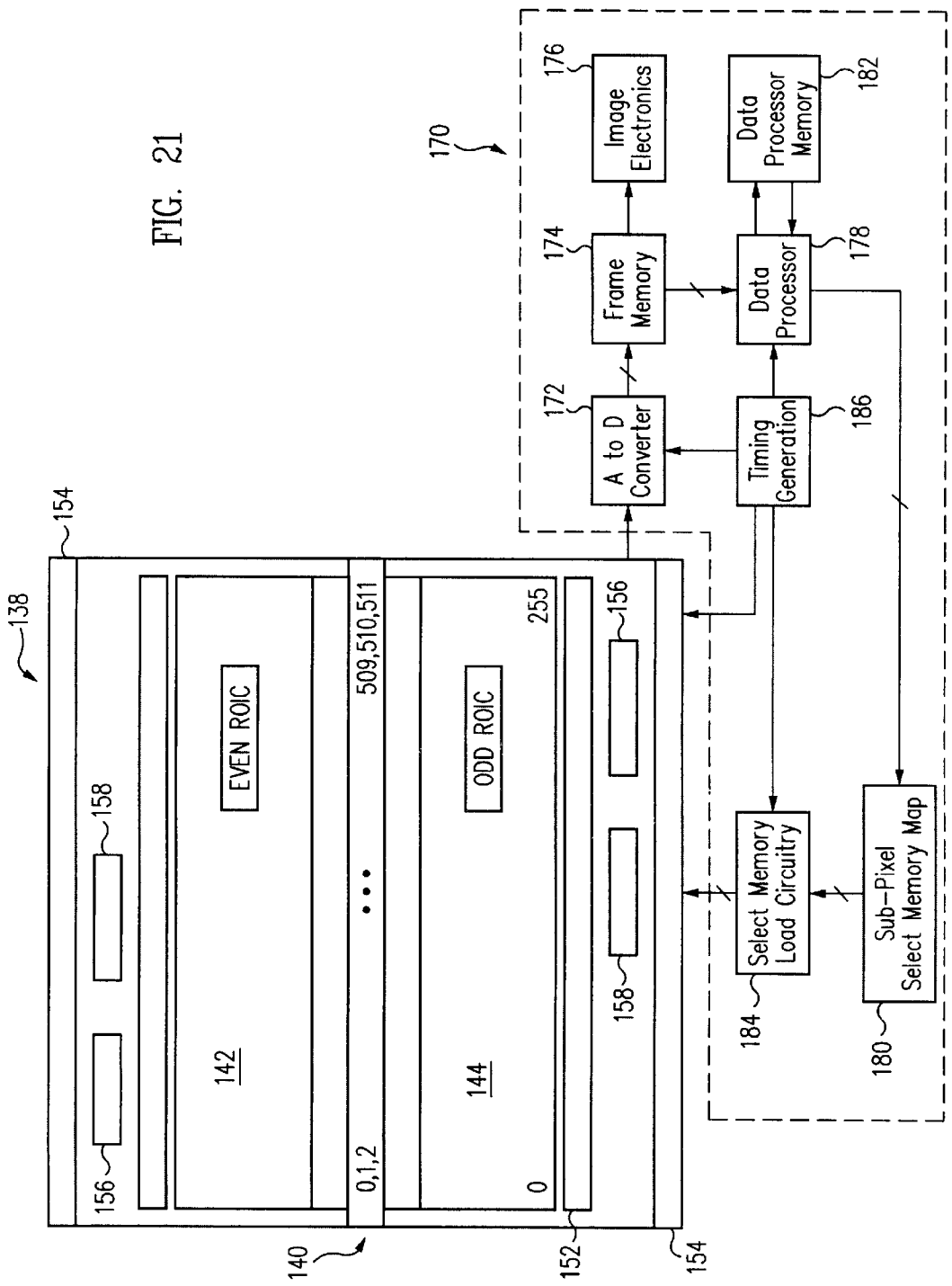
FIG. 21 is a block diagram of a system which may be used to acquire test data from an electro-optical sensor chip in accordance with an embodiment of the present invention.

FIG. 21 illustrates a conventional mixed signal testing system 170 which may be employed to configure an electro-optical sensor chip 138 in accordance with an embodiment of the present invention. One of ordinary skill in the art will recognize that the various functional blocks of testing system 170 may be implemented in a variety of ways.

In the illustrated implementation, a conventional analog to digital (A/D) converter 172 acquires and digitizes signals output by the ROIC. These signals may, for example, correspond to signals generated by detector pixels in response to light provided by a test light source (not shown). Digitized signals output by A/D converter 172 are collected in conventional frame memory 174. Conventional image electronics 176 may be used to generate an image from the digitized signals stored in frame memory 174. Conventional data processor 178 analyzes the data stored in frame memory 174 and generates sub-pixel selection memory map 180, which indicates the detector elements that are to be selected during a test. Data processor 178 may also control a test light source. Sub-pixel selection memory map 180, may include, for example, signals which control the various sub-pixel switches. Although sub-pixel selection memory map 180 is shown as separate from the other functional elements in FIG. 21, sub-pixel selection memory map 180 may be stored, for example, in data processor memory 182 or in EE-memory cells in sub-pixel selection memory loading circuitry 184. Sub-pixel selection memory loading circuitry 184 interfaces the sub-pixel selection memory map data to the ROIC selection data bus (e.g., bus 136 in FIG. 17). Timing generation circuit 186 provides timing signals similar to those indicated in FIGS. 17 and 18, for example.

The ability to select operable (e.g., defect free) and deselect defective detector elements from detector pixels in electro-optical sensor arrays in accordance with the present invention can substantially improve the operability and manufacturing yield of the inventive electro-optical sensor arrays. For a prior art electro-optical sensor array in which each detector pixel includes one detector element, each detector element must be operable for all detector pixels in the electro-optical sensor to be operable. Assuming that the best material available has a defect density that results in a probability P that a particular detector element is not defective, than the manufacturing yield $Y_{PA}$ of such prior art detector arrays having all detector pixels operable depends on the number of detector pixels N in the array according to equation (1):

$$Y_{PA}=(P)^N. \tag{1}$$

For P<1, $Y_{PA}$ drops very rapidly as the array size N increases. Table 1 indicates the expected manufacturing yields for detector arrays of several sizes assuming, as a typical example, that P=96%.

TABLE 1

Yields For Prior Art Devices

| N (number of detector pixels in array) | Yield (fraction of arrays with 100% operability) |
|---|---|
| 128 | $5.4 \times 10^{-3}$ |
| 256 | $2.9 \times 10^{-5}$ |
| 512 | $8.4 \times 10^{-10}$ |

The expected yields rapidly drop toward zero above about 100 detector pixels per array. Clearly, the typical detector material (for which P=96%) cannot be used to fabricate large (N>100) prior art arrays having 100% operability with a yield that would allow manufacturing of such arrays in large quantities.

Equation (1) also allows determination of the quality of material necessary to make, in reasonable yields, large prior art arrays in which all detector pixels are operable. For example, in order to manufacture a 100% operable prior art array of 512 detector pixels (each including one detector element) with a yield greater than about 50%, the probability that a detector element is not defective must be P>0.9986. Some detector materials are very difficult to produce with 99.86% usability. Hence, for some materials such manufacturing yields are impossible to achieve for prior art arrays.

In contrast, consider an electro-optical sensor in accordance with the present invention in which each detector pixel includes two detector elements. In such an electro-optical sensor, a detector pixel is operable if at least one of the detector elements is operable, since a defective detector element may be deselected from the detector pixel as described above. Since the probability that one detector element is defective is D=(1−P), the probability that both detector elements in a particular detector pixel are defective is $D^2=1-2P+P^2$. Hence, the probability that at least one detector element in a particular detector pixel is operable is $1-D^2=(2P-P^2)$. Thus, in this example the manufacturing yield $Y_{IN}$ of detector arrays in accordance with the present invention having all detector pixels operable depends on the number of detector pixels N in the array according to equation (2):

$$Y_{IN}=(2P-P^2)^N=(1-D^2)^N. \tag{2}$$

For comparison, equation (1) may be rewritten as equation (3)

$$Y_{PA}=(1-D)^N. \tag{3}$$

Since D<1, for positive $N(1-D^2)^N<(1-D^2)^N$ and thus the manufacturing yield of the inventive electro-optical sensor arrays ($Y_{IN}$) is greater than the manufacturing yield of the prior art arrays ($Y_{PA}$).

Table 2 indicates, for this example, the expected yields for detector arrays of several sizes in accordance with the present invention. As in Table 1, the manufacturing yields reported in Table 2 assume that P=96%. The yields reported in Tables 1 and 2 demonstrate that electro-optical sensors in accordance with embodiments of the present invention and having, for example, all detector pixels operable may be manufactured with dramatically improved yields compared to those for prior art devices.

TABLE 2

Yields For An Embodiment Of The Present Invention

| N (number of detector pixels in array) | Yield (fraction of arrays with 100% operability) |
| --- | --- |
| 128 | 0.81 |
| 256 | 0.66 |
| 512 | 0.44 |

In some applications in which both dim light and extremely bright light are incident on the electro-optical sensor at the same time, large signals provided by detector elements in response to the bright light may overwhelm the dynamic range of the sensor and make measurement of small signals provided by detector elements in response to the dim light difficult or impossible to measure. Another advantage of electro-optical sensors in accordance with the present invention is that in such cases detector elements providing the large signals may be deselected, allowing measurement of the small signals. The electro-optical sensor may be programmed by an external system in which it is employed, for example, to enable this type of measurement as needed.

In some cases the defect density in an array of detector elements in accordance with the present invention may be sufficiently high that some detector pixels cannot be made operable despite the ability to deselect defective detector elements. For example, it may be that all detector elements in a particular detector pixel are defective. This problem may be addressed in some embodiments by using switches in the ROIC to selectively combine signals from detector elements in two or more detector pixels to form a larger detector pixel. Thus a large, imperfect array may be reconfigured into an array having fewer detector pixels, all of which are operable. For example, an array having 512 detector pixels (each including multiple detector elements) but having too high of a defect density to be 100% operable may be reconfigured as, for example, a fully operable array having 256 or 128 detector pixels. Reconfigured arrays having fewer than the originally intended number of detector pixels have a market value and present an attractive alternative to scrapping an array that fails to achieve 100% operability with the originally intended number of detector pixels.

In some embodiments, for example, pairs of detector pixels may be electrically coupled to provide signals representing combined detector pixels. In the embodiment illustrated in FIG. 22, for example, detector pixels 62-1 and 62-2 may be electrically coupled to provide a signal representing a single (combined) detector pixel. In this example, the detector elements of detector pixel 62-1 are formed into two groups as described above (FIGS. 10 and 11). The detector elements of detector pixel 62-2 are similarly formed into two groups by buses 188 and 190. These groups may be selected or deselected with switches 200, 202, 204, and 206.

In combination with the group selection and deselection switches, switches 208, 210, and 212 allow any combination of the four detector element groups in detector pixels 62-1 and 62-2 to be electrically coupled to either one of integrating amplifiers 94-1 and 94-2, or to both amplifiers. The outputs of the amplifiers may be electrically coupled with switch 214 to place the amplifiers in parallel. Switches 208, 210, 212, and 214 may be controlled with signals provided by logic circuitry included, for example, in sub-pixel selection logic 72 (FIG. 8). One of ordinary skill in the art will recognize that if amplifiers 94-1 and 94-2 are each configured as in FIG. 16 to compensate for deselection of one of two detector element groups in a detector pixel, then the combined output of detector pixels 62-1 and 62-2 may be normalized for selection of from one to four detector element groups.

Other pairs of adjacent detector pixels in detector array 60 (e.g., 62-3 and 62-4, 62-5 and 62-6, . . . ) may be similarly electrically coupled to form a smaller number of combined detector pixels. In an embodiment in which detector pixels have been combined in this manner, multiplexer 100 need only sample the output of every other signal channel.

Figure 22:
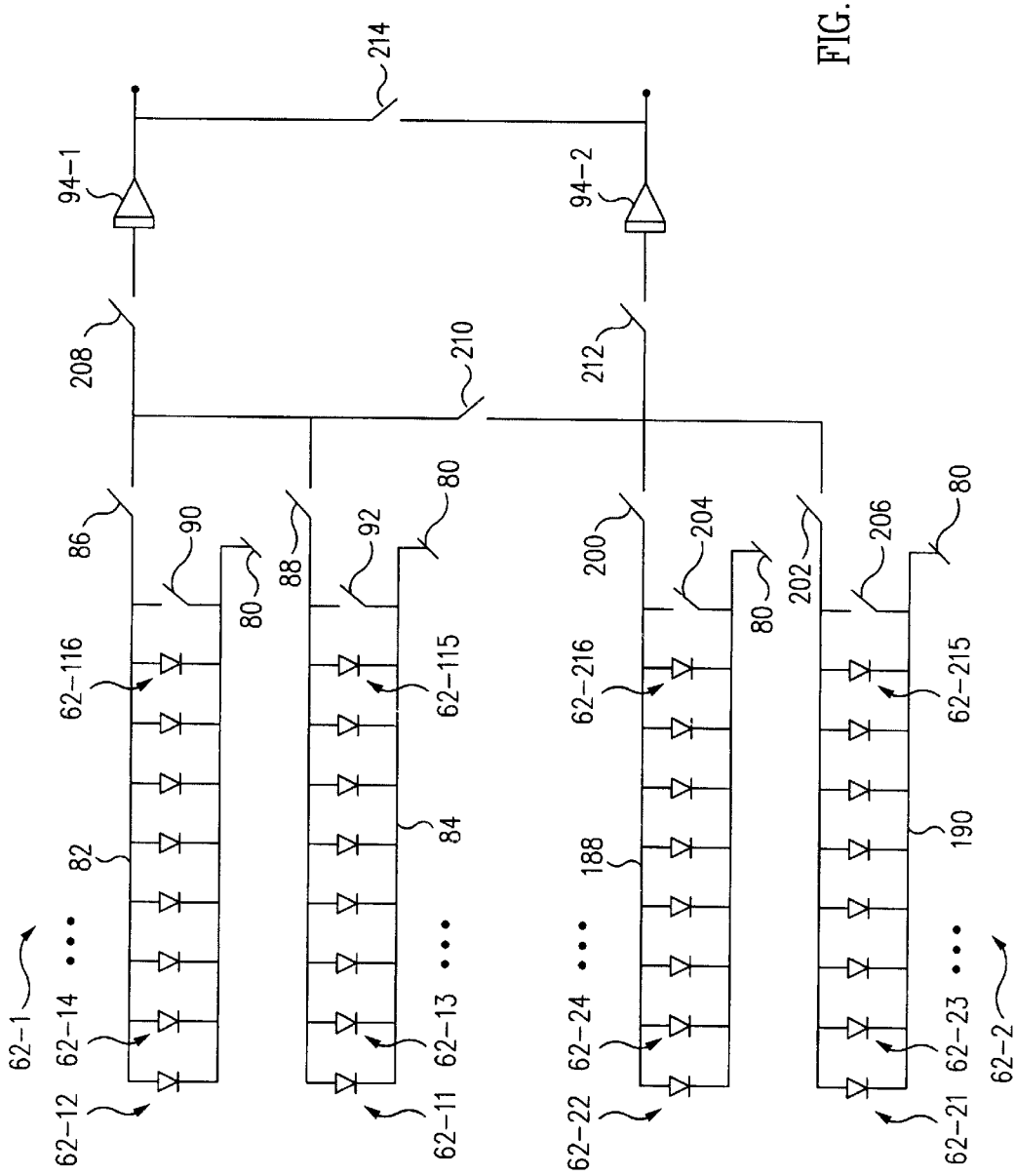
FIG. 22 is a circuit diagram of a portion of an electro-optical sensor in accordance with another embodiment of the present invention.

FIG. 22 illustrates only one of many methods by which detector pixels may be selectively coupled to one another to form larger detector pixels. In other embodiments, for example, each detector pixel may be electrically coupled to more than one other detector pixel. In some embodiments each detector pixel may be electrically coupled to all adjacent detector pixels. Referring again to FIG. 22, for example, in one embodiment detector pixels 62-1 and 62-2 are included in a linear array of detector pixels, and detector pixel 62-2 may be electrically coupled to adjacent detector pixel 62-3 and to amplifier 94-3 (not shown) by switches configured similarly to switches 210 and 212. This pattern may be continued throughout the array.

While the present invention is illustrated with particular embodiments, the invention is intended to include all variations and modifications falling within the scope of the appended claims.

We claim:

1. A sensor comprising:
   a detector pixel including a plurality of detector elements responsive to
   electromagnetic radiation;
   a plurality of switches configurable to selectively combine signals from said detector elements to provide a pixel signal corresponding to a pixel in an image; and
   an amplifier coupled to receive said pixel signal, said amplifier having a gain adjustable to compensate for exclusion from said pixel signal of one or more signals provided by said detector elements.

2. The sensor of claim 1, wherein one of said switches is configurable to include in or exclude from said pixel signal electrical signals provided by a group of two or more of said detector elements.

3. The sensor of claim 1, wherein one of said switches is configurable to include in or exclude from said pixel signal an electrical signal provided by a single one of said detector elements.

4. The sensor of claim 1, wherein at least one of said switches is configurable to short-circuit one or more of said detector elements.

5. The sensor of claim 1, wherein said detector elements are photovoltaic detectors.

6. The sensor of claim 1, wherein a long axis of each of said detector elements is oriented substantially parallel to a long axis of said detector pixel.

7. The sensor of claim 1, wherein a long axis of each of said detector elements is oriented substantially perpendicular to a long axis of said detector pixel.

8. The sensor of claim 1, wherein a long axis of each of said detector elements is oriented at an angle between about 25 degrees and about 65 degrees with respect to a long axis of said detector pixel.

9. The sensor of claim 1, wherein said detector pixel is included in a linear array of detector pixels.

10. The sensor of claim 1, wherein said detector pixel is included in a two-dimensional array of detector pixels.

11. The sensor of claim 1, wherein said detector elements are of substantially equal area.

12. The sensor of claim 1, further comprising a controller coupled to control said switches.

13. The sensor of claim 1, wherein said detector pixel is included in an array of detector pixels and said switches are included in an integrated circuit on which said array of detector pixels is mounted.

14. The sensor of claim 13, wherein the integrated circuit comprises an electro-optical sensor.

15. The sensor of claim 14, wherein the amplifier is a capacitive feedback trans-impedance amplifier.

16. The sensor of claim 15, further comprising:

a sample and hold circuit coupled to the amplifier; and a multiplexer, coupled to the sample and hold circuit, adapted to provide output signals to an output amplifier.

17. A method of configuring a sensor including a detector pixel comprising detector elements responsive to electromagnetic radiation, the method comprising:

selectively electrically coupling said detector elements to provide a signal corresponding to a pixel in an image; and adjusting amplification of said signal to compensate for detector elements not coupled to contribute to said signal.

18. The method of claim 17, further comprising configuring switches to selectively couple said detector elements.

19. The method of claim 17, further comprising testing said detector elements.

20. The method of claim 17, further comprising decoupling a defective detector element such that it does not contribute to said signal.

21. The method of claim 17, further comprising short-circuiting one or more of said detector elements.

22. The method of claim 17, further comprising programming said sensor to retain a detector element coupling configuration.

23. The method of claim 17, wherein said detector elements are of substantially equal area.

24. The method of claim 17, wherein a long axis of each of said detector elements is oriented substantially parallel to a long axis of said detector pixel.

25. The method of claim 17, wherein a long axis of each of said detector elements is oriented substantially perpendicular to a long axis of said detector pixel.

26. The method of claim 17, wherein a long axis of each of said detector elements is oriented at an angle between about 25 degrees and about 65 degrees with respect to a long axis of said detector pixel.

27. The method of claim 17, wherein the sensor includes a number of said detector pixels and the method further comprises combining selectively at least two of said detector pixels to provide a first signal corresponding to a first pixel in said image.

* * * * *